US012738444B2

(12) United States Patent
Balashov et al.

(10) Patent No.: US 12,738,444 B2
(45) Date of Patent: Sep. 15, 2026

(54) HYBRID BACKGROUND EXTRACTION IN ELECTRON HOLOGRAPHY

(71) Applicant: FEI Company, Hillsboro, OR (US)

(72) Inventors: Konstantin Balashov, Hillsboro, OR (US); Alan S. Bahm, Hillsboro, OR (US)

(73) Assignee: FEI COMPANY, Hillsboro, OR (US)

(*) Notice: Subject to any disclaimer, the term of this patent is extended or adjusted under 35 U.S.C. 154(b) by 282 days.

(21) Appl. No.: 18/630,277

(22) Filed: Apr. 9, 2024

(65) Prior Publication Data

US 2025/0316440 A1 Oct. 9, 2025

(51) Int. Cl.

*G06K 9/00* (2022.01)
*G06T 5/70* (2024.01)
*H01J 37/06* (2006.01)
*H01J 37/153* (2006.01)

(52) U.S. Cl.

CPC .............. *H01J 37/153* (2013.01); *G06T 5/70* (2024.01); *H01J 37/06* (2013.01); *H01J 2237/221* (2013.01)

(58) Field of Classification Search

CPC .... H01J 2237/221; H01J 37/06; H01J 37/153; G03H 2227/03; G03H 2226/11; G03H 2223/53; G03H 2001/0447; G03H 1/0443; G03H 5/00; G03H 1/00; G03H 3/00; G06T 5/70; G06T 7/194; H04N 23/81; G06V 10/36; G06V 10/34; G06V 10/993; G06V 10/30

See application file for complete search history.

(56) References Cited

PUBLICATIONS

Midoh, Yoshihiro, and Koji Nakamae. "Accuracy improvement of phase estimation in electron holography using noise reduction methods." Microscopy 69.2 (2020): 123-131. (Year: 2020).*

Cheremkhin, Pavel A., et al. "Digital hologram quality improvement by elimination of imaging sensor noise." Optics, Photonics, and Digital Technologies for Imaging Applications V. vol. 10679. SPIE, 2018. (Year: 2018).*

Extended European Search Report received for European Patent Application Serial No. 25163271.7 dated Aug. 27, 2025, 06 pages.

Midoh et al., "Accuracy Improvement of Phase Estimation in Electron Holography Using Noise Reduction Methods", Microscopy, vol. 69, No. 2, Jan. 15, 2020, pp. 123-131.

(Continued)

*Primary Examiner* — Avinash Yentrapati

(74) *Attorney, Agent, or Firm* — Amin, Turocy & Watson, LLP

(57) ABSTRACT

Embodiments herein relate to a process for electron holography image background extraction. A system can comprise a memory that stores, and a processor that executes, computer executable components. The computer executable components can comprise a blurring component that executes a primary blurring action and a secondary blurring action on an original electron holography (EH) image characterized by a set of pixels having a set of original pixel values, and a generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

20 Claims, 23 Drawing Sheets

(56) References Cited

PUBLICATIONS

Cheremkhin et al., "Digital Hologram Quality Improvement by Elimination of Imaging Sensor Noise", Proceedings of SPIE, vol. 10679, May 24, 2018, 11 pages.
Garcia-Sucerquta et al., "Improvement of the Signal-to-Noise Ratio in Digital Holography", Revista mexicana de fisica, vol. 51, No. 1, Feb. 2005, pp. 76-81.
Lindquist, Nathan C. "An Introduction to Lensless Digital Holographic Microscopy", Miniature Fluidic Devices for Rapid Biological Detection, 2018, pp. 147-170.

* cited by examiner

SCIENTIFIC INSTRUMENT MODULE 100

FIRST (SIGNAL ACQUISITION) LOGIC 102

SECOND (PHYSICAL BLURRING) LOGIC 104

THIRD (DIGITAL BLURRING) LOGIC 106

FOURTH (PIXEL VALUE GENERATION) LOGIC 108

FIFTH (NOTIFICATION GENERATION) LOGIC 110

COMBINED (PHYSICALLY & DIGITALLY) BLURRED IMAGE 1300

DIGITALLY BLURRED
ORIGINAL IMAGE 1400

HYBRID BACKGROUND EXTRACTION IN ELECTRON HOLOGRAPHY

BACKGROUND

Scientific instruments for use in material analysis can aid in determining the makeup and properties of an unknown composition. In one or more examples, a scientific instrument can provide reconstruction in energy-based holograms to allow for better viewing of features of an unknown composition. Preparation of pixel data prior to the reconstruction can comprise one or more modifications of a raw or original energy-based holograms image.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings. It is noted that one or more figures may comprise illustration of a blurred effect characterized by lack of clarity of an image.

SUMMARY

Figure 1:
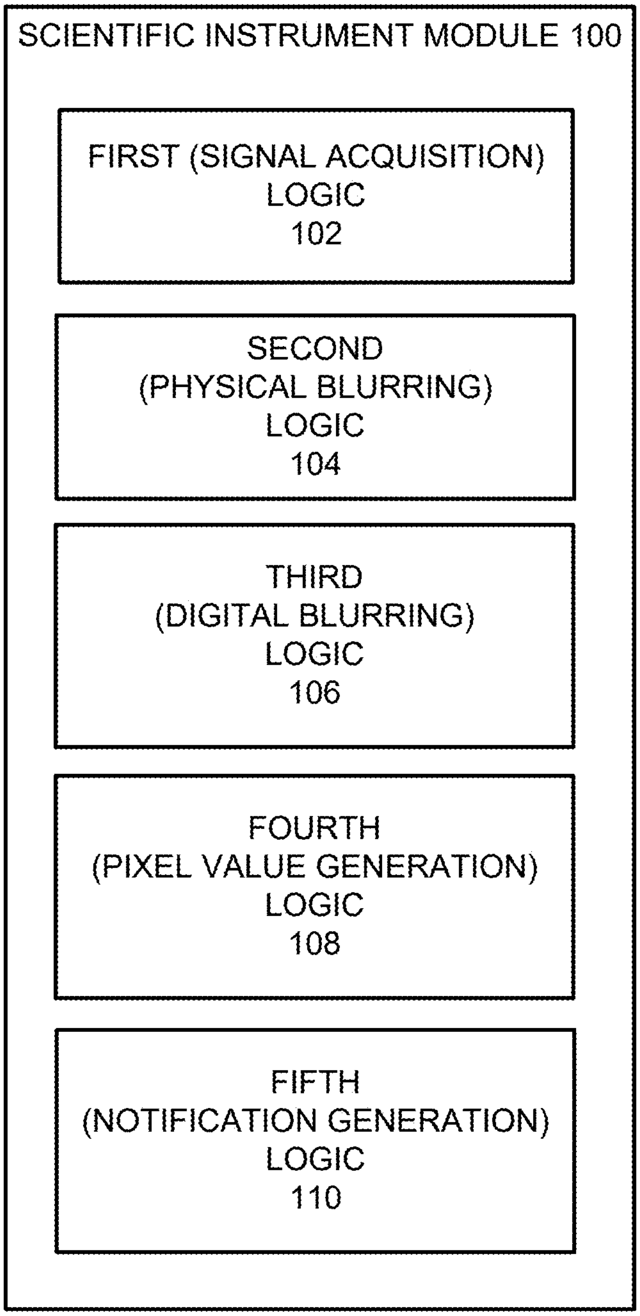
FIG. 1 illustrates a block diagram of an example scientific instrument for performing one or more operations, in accordance with one or more embodiments described herein.

The following presents a summary to provide a basic understanding of one or more embodiments described herein. This summary is not intended to identify key or critical elements, and/or to delineate scope of particular embodiments or scope of claims. Its sole purpose is to present concepts in a simplified form as a prelude to the more detailed description that is presented later. In one or more embodiments, systems, computer-implemented methods, apparatuses and/or computer program products described herein can provide a process for electron holography image background extraction, to thereby aid in reconstruction of a hologram resulting from an electron holography imaging, such as electron energy hologram imaging (e.g., from application of an energy source to a target composition).

In accordance with an embodiment, a system can comprise a memory that stores computer executable components, and a processor that executes the computer executable components. The computer executable components can comprise a blurring component that executes a primary blurring action and a secondary blurring action on an original electron holography (EH) image characterized by a set of pixels having a set of original pixel values; and generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

In accordance with another embodiment, a computer-implemented method can comprise executing, by a system operatively coupled to a processor, a modification of a set of original pixel values of a set of pixels characterizing an original electron holography (EH) image, wherein the executing comprises employing a distortion technique at an imaging device capturing the EH image and subsequently applying a digital blurring to the set of original pixel values; and generating, by the system, a set of modified pixel values, for the set of pixels, based on a difference of a set of first pixel values, of the set of pixels, resulting from the employing of the distortion technique and a set of second pixel values, of the set of pixels, resulting from the applying of the digital blurring.

In accordance with still another embodiment, a computer program product facilitates a process for electron holography image background extraction, the program instructions executable by a processor to cause the processor to execute, by the processor, a primary blurring action and a secondary blurring action on an original electron holography (EH) image characterized by a set of pixels having a set of original pixel values; and generate, by the processor, a set of modified pixel values, for the set of pixels, based on a difference of a set of first pixel values, of the set of pixels, resulting from the primary blurring action and a set of second pixel values, of the set of pixels, resulting from the secondary blurring action.

The one or more embodiments disclosed herein can achieve improved performance relative to existing approaches. For example, based at least on application of a pair of blurring executions to an original image (also herein referred to as a raw image) output from an energy-based hologram imaging device, image contamination can be reduced to a level much lower than is possible using existing approaches. The image contamination reduction can comprise reduction of detector imperfections, sensor contamination, ambient noise, malfunctioning pixels and/or other detector imperfection effects. Accordingly, preparation of an electron holography (EH) signal upon which a reconstructed image is based can be more efficient and more aggressively reduce such image contamination as compared to existing approaches.

The one or more embodiments described herein can be implemented within, in connection with and/or coupled to an electron holography (EH) imaging device.

As a result of use of the one or more embodiments described herein, image contamination can be removed from a background of a hologram, thus improving quality of a subsequent hologram reconstruction based on an output of the one or more embodiments described herein.

DETAILED DESCRIPTION

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Various operations can be described as multiple discrete actions or operations in turn, in a manner that is most helpful in understanding the subject matter disclosed herein. However, the order of description should not be construed as to imply that these operations are necessarily order dependent. In particular, these operations can be performed in an order different from the order of presentation. Operations described can be performed in a different order from the described embodiment. Various additional operations can be performed, and/or described operations can be omitted in additional embodiments.

Turning now to the subject of material analysis and to the one or more embodiments described herein, one method of obtaining composition imaging can be electron imaging where a target composition is targeted by an energy source, ultimately resulting in a signal that can be employed to generate an energy-based hologram, such as an in-line electron hologram or for in-line holography by other waves and particles such as light (EM wave), sound (pressure wave) and/or neutron and/or proton waves (matter waves). That is, the embodiments described herein are applicable to different types of holograms, including in-line holograms, electron energy holograms and/or other types of holograms, even where only an example of an energy-based or electron energy hologram is used and/or described.

From the hologram, a reconstructed image of the target composition can be reconstructed. The reconstruction can employ back propagation, among other methods. That is, reconstruction in holograms, such as low energy electron holograms (LEEH), can employ wave propagation techniques of Fourier optics. Holograms are measured by a detector with finite number of pixels (e.g. 512×512). To avoid image contamination-detector contamination, such as caused by a detector imperfection, or device contamination, such as caused by uneven sensitivity of the imaging system to an electron beam-processing of an image, and/or of the signal upon which the image is based, can be performed. As a result, one or more image contaminations can be reduced and/or altogether removed. This can therefore aid in clarifying a background of an image from which a hologram reconstruction can be generated, which in turn can improve reconstruction quality of the hologram reconstruction.

In one existing example of hologram processing and subsequent reconstruction, the raw or original hologram can be a low energy electron holography (LEEH) hologram. LEEH uses an electron emitter to illuminate an object creating an in-line hologram which is detected by a sensitive pixelated electron detector. The emission pattern can vary from time to time, and is non-uniform, thus causing device contamination. For example, a respective detector of an LEEH imaging device can function with weak signal and therefore can be extremely sensitive to noise or other contamination, such as on its surface, which can block and/or reduce an original signal upon which an original hologram can be based.

Subsequently, the hologram can be reconstructed by a numerical reconstruction algorithm to produce a reconstructed image of a target object. Often, numerical reconstruction algorithms can employ evenly normalized signal level across the image. Accordingly, it can be desired to achieve both normalizing for the corresponding emission pattern and normalizing for detector noise. As used herein, an "emission pattern" is the underlying data signal corresponding to an image/hologram. As used herein, "image" can be used interchangeably with "hologram" and/or "holograph." As used herein, an "image" can refer to any image of any one or more objects, backgrounds, environments, targets, materials and/or the like.

Conventional frameworks for noise subtraction and emission pattern subtraction often interfere with one another and/or fail to remove the other, and thus can result in reduced noise subtraction and/or reduced emission pattern subtraction. For example, use of digital blurring, such as Gaussian blurring, can remove undesired effects from an emission pattern, but does not effect uneven detector sensitivity. As a result, detector sensitivity (e.g., device contamination) can remain in the original signal/original image. While a separate method may be able to be employed for the device contamination, such process is both inaccurate and inefficient.

Therefore, to account for one or more inabilities and/or deficiencies of existing frameworks (e.g., existing image preparation frameworks), one or more embodiments are described herein that can employ a unique image preparation framework to achieve high image contamination removal and thus allow for high information gathering from a signal resulting from application of an energy stream to a target composition. One or more image preparation frameworks described herein can be hybrid frameworks and can perform modification of the image and/or underlying signal such as by a combination of digital blurring, physical blurring and combined digital and physical blurring, thereby resulting in an efficient and effective reduction of image contamination, which can increase subsequent image reconstruction quality.

As a result, a desired increase in information obtained from an image reconstructed from the processed image/signal can be obtained, as compared to existing image preparation framework. This increase in information can be at least partially due to reduction of detector contamination (e.g., detector imperfection results) or device contamination (e.g., uneven sensitivity results) artifacts, which can be undesirably added to an acquired hologram signal during hologram signal acquisition.

Discussion next turns to a general discussion of one or more scientific instrument systems disclosed herein, as well as related methods, computing devices, and computer-readable media. For example, in one or more embodiments, a system can comprise a memory that stores computer executable components and a processor that executes the computer executable components stored in the memory. The computer executable components can comprise a blurring component that executes a primary blurring action and a secondary blurring action on an original electron holography (EH) image characterized by a set of pixels having a set of original pixel values, and a generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

The one or more embodiments disclosed herein can achieve improved performance relative to existing approaches. For example, based on application of a combination of digital blurring, separate physical blurring, and combined digital and physical blurring, reduction in undesirable image contamination (e.g., detector and/or device contamination, among other examples of image contamination) in connection with generation of an object image from the hologram can be provided. That is, use of the combined blurring approach can allow for increase of information being used to generate a subsequent reconstructed object image.

Moreover, an embodiment described herein can beneficially provide focus/direction for plural targets at least partially in parallel with one another. For example, holograms from two or more targets being acted on by two or more different energy sources can be processed for image contamination reduction at least partially in parallel with one another by a same image preparation system and/or separate image preparation system.

Further, the embodiments described herein can be adapted to work with non-square detectors, detectors with broken pixels, combined holograms (e.g., resulting from holograms taken relative to shifted sampling), and/or holograms having limited or patchy illumination.

The embodiments disclosed herein thus can provide improvements to scientific instrument technology (e.g., improvements in the computer technology supporting such scientific instruments, among other improvements), which can be employed in various fields including optics, signal processing, spectroscopy, and nuclear magnetic resonance (NMR), without being limited thereto.

Various ones of the embodiments disclosed herein can improve upon existing approaches to achieve the technical advantages of high information reconstructions and/or low artifact generation in such reconstructions. That is, use of the image preparation framework provided herein can greatly reduce generated image contamination by removing the contamination. It is noted that this is different from preventing the contamination outright.

Such technical advantages are not achievable by routine and/or existing approaches, and all user entities of systems including such embodiments can benefit from these advantages (e.g., by assisting the user entity in the performance of a technical task, such as identification of one or more target compositions, by means of an image preparation using an image preparation framework discussed herein).

The technical features of the embodiments disclosed herein (e.g., modification of the hologram using a combination of physical and digital blurring) are thus decidedly unconventional in the field of material analysis, in addition to the fields of optics, signal processing, spectroscopy, and/or NMR, without being limited thereto, as are combinations of the features of the embodiments disclosed herein.

As discussed further herein, various aspects of the embodiments disclosed herein can improve the functionality of a computer itself. That is, the computational and user interface features disclosed herein do not involve only the collection and comparison of information but instead apply new analytical and technical techniques to change the operation of the computer-analysis of material compounds. For example, based on the signal obtained from an energy stream interacting with a target composition, a cleaning or other processing of such signal can be performed. Based at least on these processes, a subsequent computer-directed process of image reconstructions can be made easier and more efficient through reduction of generated image contamination after it has been generated by the system or corresponding device and/or system. As such, a non-limiting system described herein, comprising an image preparation system, can be self-improving.

The present disclosure thus introduces functionality that neither an existing computing device, nor a human, could perform. Rather, such existing computing devices are both inefficient and ineffective at removal and/or processing of both device contamination and detector contamination, resulting in loss or degeneration of signal corresponding to an original image generated by an image generated device (e.g., using LEEH) In view of the time, energy and/or loss of data involved, it is not practical to operate within the confines of existing approaches.

Accordingly, the embodiments of the present disclosure can serve any of a number of technical purposes, such as controlling a specific technical system or process; determining from measurements how to control a machine; digital audio, image, or video enhancement or analysis; separation of material sources in a mixed signal; generating data for reliable and/or efficient transmission or storage; providing estimates and confidence intervals for material samples; or providing a faster processing of sensor data. In particular, the present disclosure provides technical solutions to technical problems, including, but not limited to, hologram modification; image/signal blurring; application of combined blurring techniques; and/or subsequent image reconstruction, resulting in a faster, more thorough and/or more efficient processing of generated images and thus of material samples or other target compositions being imaged.

The embodiments disclosed herein thus provide improvements to material analysis technology (e.g., improvements in the computer technology supporting material analysis, among other improvements).

As used herein, the phrase "based on" should be understood to mean "based at least in part on," unless otherwise specified.

As used herein, the term "component" can refer to an atomic element, molecular element, phase of an atomic or molecular element, or combination thereof.

As used herein, the term "data" can comprise metadata.

As used herein, the terms "entity," "requesting entity," and "user entity" can refer to a machine, device, component, hardware, software, smart device, party, organization, individual and/or human.

One or more embodiments are now described with reference to the drawings, where like referenced numerals are used to refer to like drawing elements throughout. In the following description, for purposes of explanation, numerous specific details are set forth in order to provide a more thorough understanding of the one or more embodiments. It is evident in various cases, however, that the one or more embodiments can be practiced without these specific details.

Further, it should be appreciated that the embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning now in particular to the one or more figures, and first to FIG. 1, illustrated is a block diagram of a scientific instrument module 100 for performing material analysis operations using a combination hologram blurring technique, in accordance with various embodiments described herein. The scientific instrument module 100 can be implemented by circuitry (e.g., including electrical and/or optical components), such as a programmed computing device. The logic of the scientific instrument module 100 can be included in a single computing device or can be distributed across multiple computing devices that are in communication with each other as appropriate. Examples of computing devices that can, singly or in combination, implement the scientific instrument module 100 are discussed herein with reference to the computing device 400 of FIG. 4, and examples of systems of interconnected computing devices, in which the scientific instrument module 100 can be implemented across one or more of the computing devices, is discussed herein with reference to the scientific instrument system 2100 of FIG. 21.

The scientific instrument module 100 can include first logic 102, second logic 104, third logic 106, fourth logic 108 and fifth logic 110. As used herein, the term "logic" can include an apparatus that is to perform a set of operations associated with the logic. For example, any of the logic elements included in the module 100 can be implemented by one or more computing devices programmed with instructions to cause one or more processing devices of the computing devices to perform the associated set of operations. In a particular embodiment, a logic element can include one or more non-transitory computer-readable media having instructions thereon that, when executed by one or more processing devices of one or more computing devices, cause the one or more computing devices to perform the associated set of operations. As used herein, the term "module" can refer to a collection of one or more logic elements that, together, perform a function associated with the module. Different ones of the logic elements in a module can take the same form or can take different forms. For example, some logic in a module can be implemented by a programmed general-purpose processing device, while other logic in a module can be implemented by an application-specific integrated circuit (ASIC). In another example, different ones of the logic elements in a module can be associated with different sets of instructions executed by one or more processing devices. A module can omit one or more of the logic elements depicted in the associated drawing; for example, a module can include a subset of the logic elements depicted in the associated drawing when that module is to perform a subset of the operations discussed herein with reference to that module.

The first logic 102 can receive, find, locate, download, request and/or otherwise obtain a signal corresponding to an energy-based hologram (e.g., resulting from electron input to a target composition). That is, the first logic 102 can obtain data for being processed and for subsequent use in generating a reconstructed image of a target, such as a target composition.

The second logic 104 can direct and/or cause physical blurring of an original hologram (e.g., the energy-based hologram). In one or more embodiments, physical blurring can be caused by vibration of a sensor or fast alternating electromagnetic field on an electron path of an electron beam of an imaging device. That is, the second logic 104 can direct and/or cause change of pixel values of pixels comprised by the original hologram.

The third logic 106 can direct and/or cause digital blurring, such as Gaussian blurring, of an original hologram (e.g., the energy-based hologram). As used herein, "Gaussian blurring" can refer to application of a mathematical function to data defining an image, such as pixel values, to thereby blur the image. That is, the third logic 106 also can direct and/or cause change of pixel values of pixels comprised by the original hologram.

In one or more embodiments, second logic 104 and third logic 106 can be used in combination, such as at least partially at the same time as one another or in succession to one another to direct and/or cause combined blurring. The combined blurring can include effects of both the digital blurring and the physical blurring.

The fourth logic 108 can generate one or more resultant pixel values based on use of the digital blurring, physical blurring and/or differences between results of the various blurrings (e.g., digital blurring, physical blurring and/or combined blurring). That is, the fourth logic 108 can generate pixel values corresponding to luminosity values and/or color values of one or more pixels comprised by a modified image (e.g., an image acted upon due to the second logic 104 and/or third logic 106).

The fifth logic 110 can generate a notification corresponding to a determination that an image based on a set of modified pixel values (e.g., resulting from the fourth logic 108) comprises a reduced level of contamination as compared to an original level of contamination of the original EH image.

Figure 2:
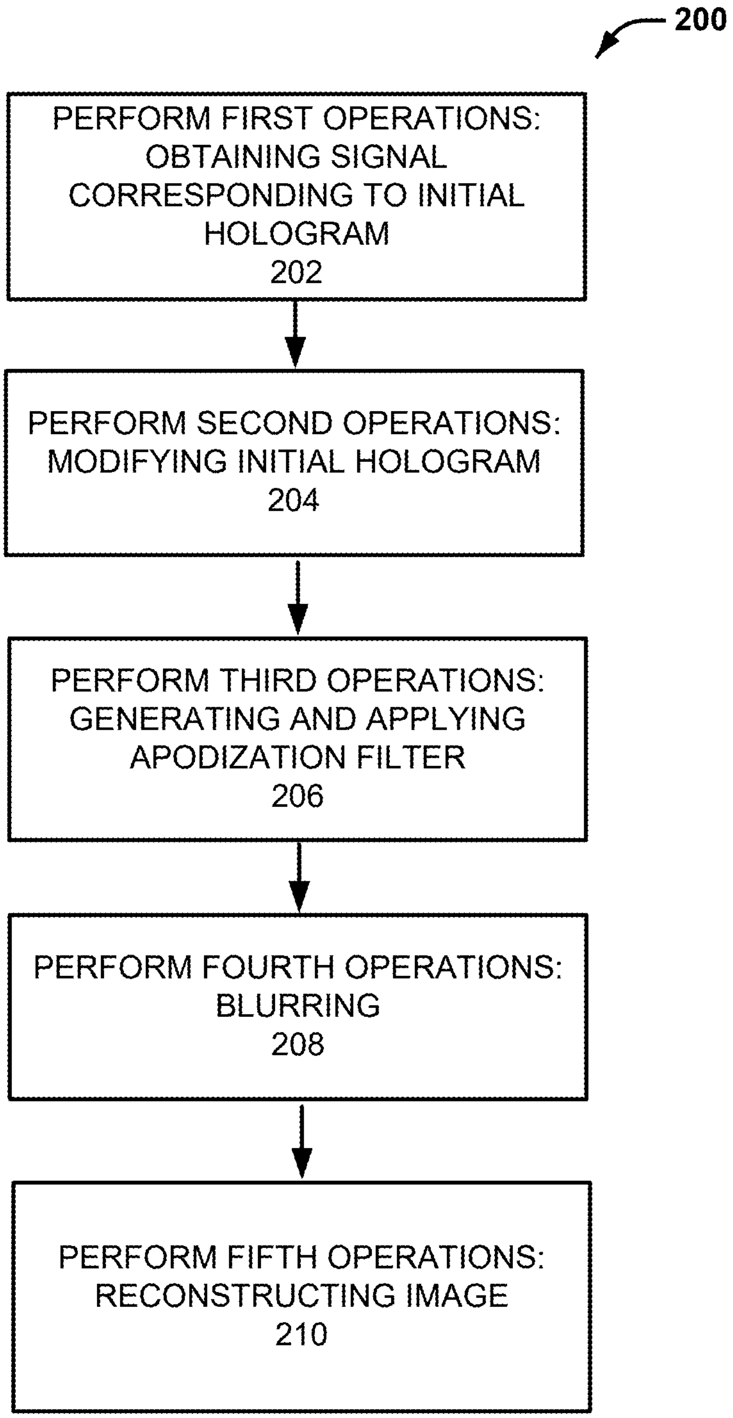
FIG. 2 illustrates a flow diagram of an example method of performing operations using the scientific instrument of FIG. 1, in accordance with one or more embodiments described herein.

FIG. 2 illustrates a flow diagram of a method 200 of performing operations, by the scientific instrument module 100, in accordance with various embodiments. Although the operations of the method 200 can be illustrated with reference to particular embodiments disclosed herein (e.g., the scientific instrument module 100 discussed herein with reference to FIG. 1, the GUI 300 discussed herein with reference to FIG. 3, the computing device 400 discussed herein with reference to FIG. 4, and/or the scientific instrument system 2100 discussed herein with reference to FIG. 21), the method 200 can be used in any suitable setting to perform any suitable operations. Operations are illustrated once each and in a particular order in FIG. 2, but the operations can be reordered and/or repeated as desired and appropriate (e.g., different operations performed can be performed in parallel, as suitable).

At 202, first operations can be performed. For example, the first logic 102 of the module 100 can perform the first operations 202. The first operations 202 can include obtaining a signal corresponding to an energy-based hologram (e.g., resulting from electron input to a target composition).

At 204, second operations can be performed. For example, the second logic 104 of the module 100 can perform the second operations 204. The second operations 204 can comprise execution of a physical blurring of the original image such as by causing a physical vibration and/or alternating an electromagnetic field on an electron path of an electron beam generated by an imaging device generating the original hologram. In such way, while image contamination can already be present at the detector or device, such image contamination can be reduced.

At 206, third operations can be performed. For example, the third logic 106 of the module 100 can perform the third operations 206. The third operations 206 can comprise digital blurring by applying a mathematical function to data defining an image, such as pixel values, to thereby blur the image.

At 208, fourth operations can be performed. For example, the fourth logic 108 of the module 100 can perform the fourth operations 208. The fourth operations 208 can comprise generation of a set of pixel values for a set of pixels comprised by a modified image that is based on the original image. This set of pixel values can be employed to generate an image reconstruction and/or to generate a modified image prior to the image reconstruction.

At 210, fifth operations can be performed. For example, the fifth logic 110 of the module 100 can perform the fifth operations 210. The fifth operations 210 can include generating a corresponding to a determination that an image based on the set of modified pixel values comprises a reduced level of contamination as compared to an original level of contamination of the original EH image.

Figure 21:
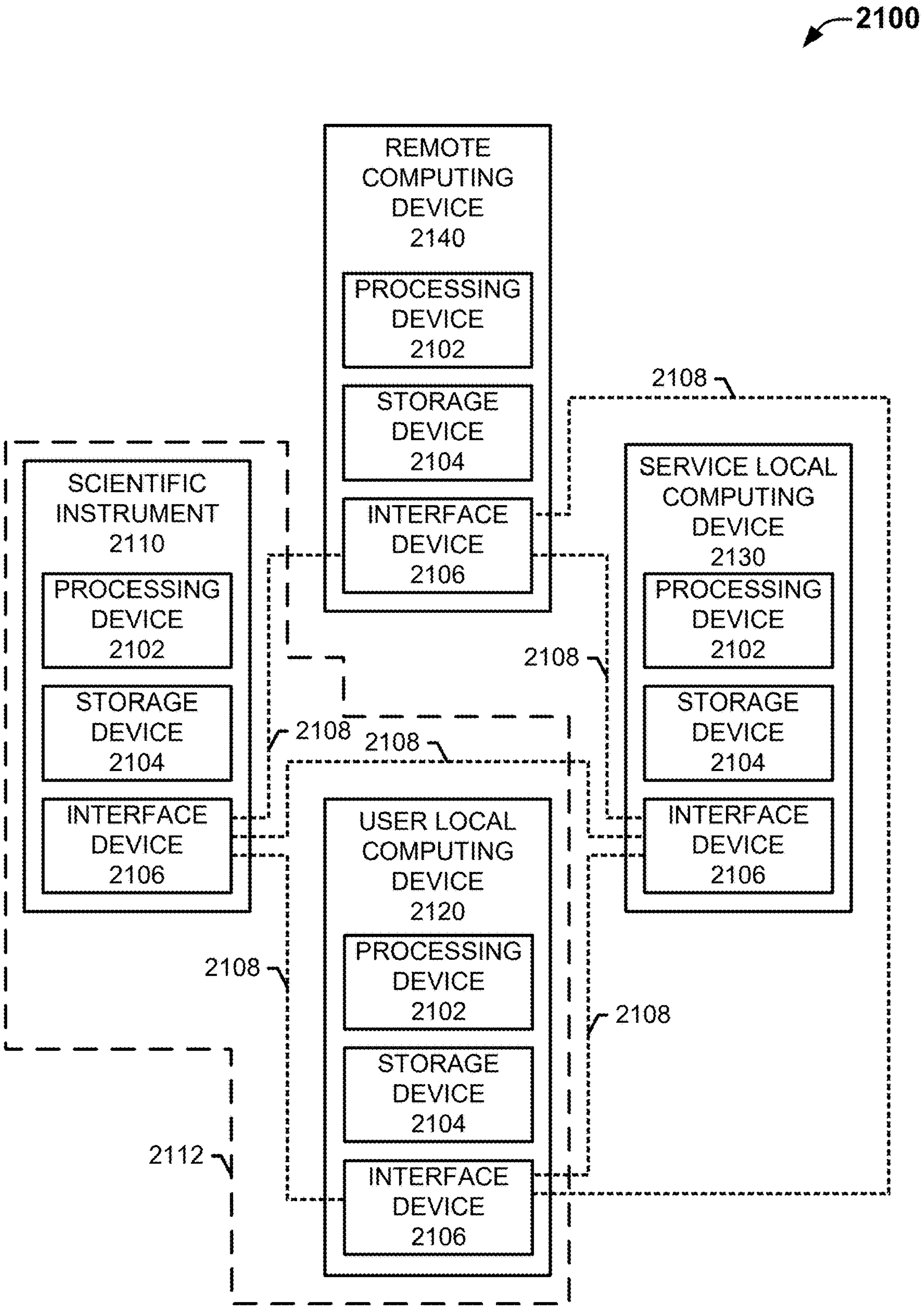
FIG. 21 illustrates a block diagram of example scientific instrument system in which one or more of the methods described herein can be performed, in accordance with one or more embodiments described herein.

The scientific instrument methods disclosed herein can include interactions with a user entity (e.g., via the user local computing device 2120 discussed herein with reference to FIG. 21). These interactions can include providing information to the user entity (e.g., information regarding the operation of a scientific instrument such as the scientific instrument 2110 of FIG. 21, information regarding a sample being analyzed or other test or measurement performed by a scientific instrument, information retrieved from a local or remote database, or other information) or providing an option for a user entity to input commands (e.g., to control the operation of a scientific instrument such as the scientific instrument 2110 of FIG. 21, or to control the analysis of data generated by a scientific instrument), queries (e.g., to a local or remote database), or other information. In some embodiments, these interactions can be performed through a graphical user interface (GUI) that includes a visual display on a display device (e.g., the display device 410 discussed herein with reference to FIG. 4) that provides outputs to the user entity and/or prompts the user entity to provide inputs (e.g., via one or more input devices, such as a keyboard, mouse, trackpad, or touchscreen, included in the other I/O devices 412 discussed herein with reference to FIG. 4). The scientific instrument system 2100 disclosed herein can include any suitable GUIs for interaction with a user entity.

Figure 3:
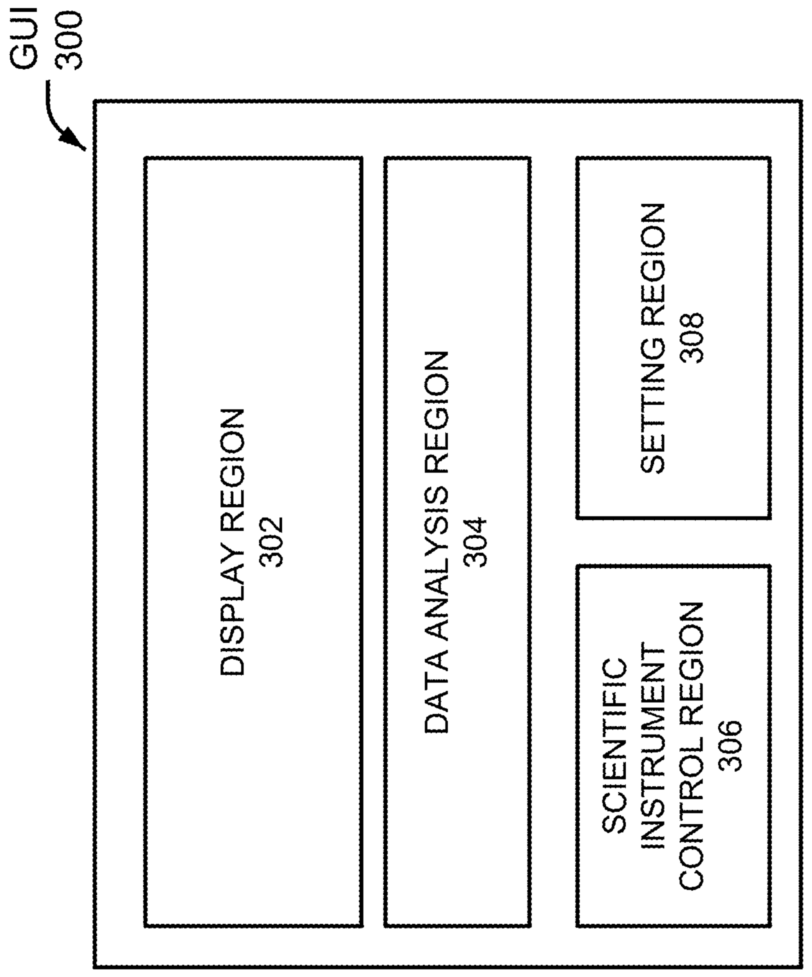
FIG. 3 illustrates a graphical user interface (GUI) that can be used in the performance of one or more of the methods described herein, in accordance with one or more embodiments described herein.

Turning next to FIG. 3, depicted is an example GUI 300 that can be used in the performance of one or more of the methods described herein, in accordance with various embodiments described herein. As noted above, the GUI 300 can be provided on a display device (e.g., the display device 410 discussed herein with reference to FIG. 4) of a computing device (e.g., the computing device 400 discussed herein with reference to FIG. 4) of a scientific instrument system (e.g., the scientific instrument system 2100 discussed herein with reference to FIG. 21), and a user entity can interact with the GUI 300 using any suitable input device (e.g., any of the input devices included in the other I/O devices 412 discussed herein with reference to FIG. 4) and input technique (e.g., movement of a cursor, motion capture, facial recognition, gesture detection, voice recognition, actuation of buttons, etc.).

The GUI 300 can include a data display region 302, a data analysis region 304, a scientific instrument control region 306, and a settings region 308. The particular number and arrangement of regions depicted in FIG. 3 is merely illustrative, and any number and arrangement of regions, including any desired features thereof, can be included in a GUI 300.

The data display region 302 can display data generated by a scientific instrument (e.g., the scientific instrument 2110 discussed herein with reference to FIG. 21). For example, the data display region 302 can display one or more output results which can comprise text, graphs, notification, charts, matrices and/or spectra, without being limited thereto.

The data analysis region 304 can display the results of data analysis (e.g., the results of analyzing the data illustrated in the data display region 302 and/or other data). For example, the data analysis region 304 can display one or more of the output results. In one or more cases, the data analysis region 304 can display a list, flow chart or other schematic of acquisition actions taken and/or recommended relative to an experiment. In one or more embodiments, the data display region 302 and the data analysis region 304 can be combined in the GUI 300 (e.g., to include data output from a scientific instrument, and some analysis of the data, in a common graph or region).

The scientific instrument control region 306 can include options that allow the user entity to control a scientific instrument (e.g., the scientific instrument 2110 discussed herein with reference to FIG. 21). For example, the scientific instrument control region 306 can include one or more controls for inputting one or more metrics of interest.

Figure 4:
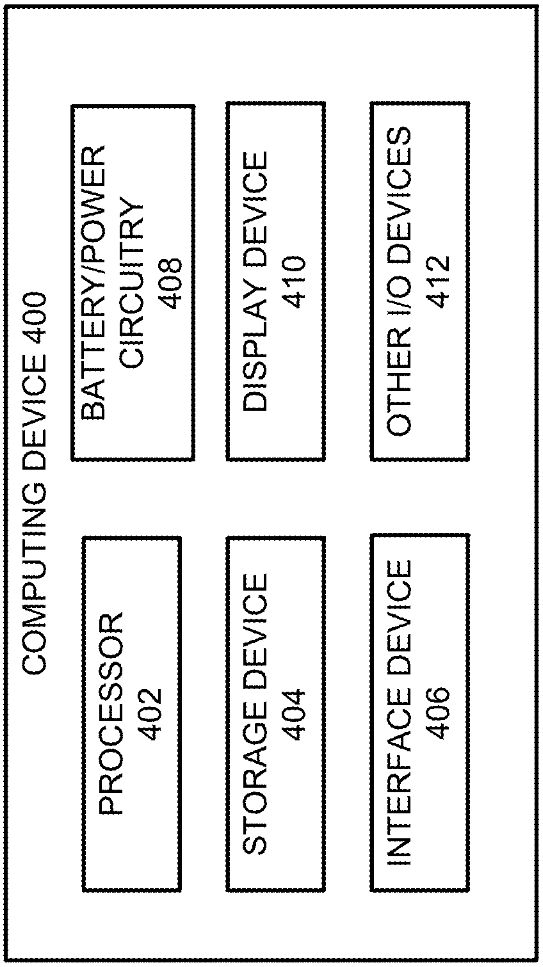
FIG. 4 illustrates a block diagram of an example computing device that can perform one or more of the methods disclosed herein, in accordance with one or more embodiments described herein.

The settings region 308 can include options that allow the user entity to control the features and functions of the GUI 300 (and/or other GUIs) and/or perform common computing operations with respect to the data display region 302 and data analysis region 304 (e.g., saving data on a storage device, such as the storage device 404 discussed herein with reference to FIG. 4, sending data to another user entity, labeling data, etc.). For example, the settings region 308 can include one or more options to alter color, fill or format of illustrations, such as an illustration of any of FIGS. 11 to 17, to be described below.

As noted above, the scientific instrument module 100 can be implemented by one or more computing devices. Accordingly, discussion next turns to FIG. 4, which illustrates a block diagram of a computing device 400 that can perform some or all of the scientific instrument methods disclosed herein, in accordance with various embodiments. In one or more embodiments, the scientific instrument module 100 can be implemented by a single computing device 400 or by multiple computing devices 400. Further, as discussed below, a computing device 400 (or multiple computing devices 400) that implements the scientific instrument module 100 can be part of one or more of the scientific instrument 2110, the user local computing device 2120, the service local computing device 2130, or the remote computing device 2140 of FIG. 21.

The computing device 400 of FIG. 4 is illustrated as having a number of components, but any one or more of these components can be omitted or duplicated, as suitable for the application and setting. As illustrated, these components can include one or more of a processor 402, storage device 404, interface device 406, battery/power circuitry 408, display device 410 and other input/output (I/O) devices 412, as will be described below.

In one or more embodiments, one or more of the components included in the computing device 400 can be attached to one or more motherboards and enclosed in a housing (e.g., including plastic, metal, and/or other materials). In one or more embodiments, some these components can be fabricated onto a single system-on-a-chip (SoC) (e.g., an SoC can include one or more processors 402 and one or more storage devices 404). Additionally, in one or more embodiments, the computing device 400 can omit one or more of the components illustrated in FIG. 4. In one or more embodiments, the computing device 400 can include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 400 can omit a display device 410, but can include display device interface circuitry (e.g., a connector and driver circuitry) to which a display device 410 can be coupled.

The computing device 400 can include the processor 402 (e.g., one or more processing devices). As used herein, the term "processing device" can refer to any device or portion of a device that processes electronic data from registers and/or memory to transform that electronic data into other electronic data that can be stored in registers and/or memory. The processor 402 can include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 400 can include a storage device 404 (e.g., one or more storage devices). The storage device 404 can include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In one or more embodiments, the storage device 404 can include memory that shares a die with a processor 402. In such an embodiment, the memory can be used as cache memory and can include embedded dynamic random-access memory (eDRAM) or spin transfer torque magnetic random-access memory (STT-MRAM), for example. In one or more embodiments, the storage device 404 can include non-transitory computer readable media having instructions thereon that, when executed by one or more processing devices (e.g., the processor 402), cause the computing device 400 to perform any appropriate ones of or portions of the methods disclosed herein.

The computing device 400 can include an interface device 406 (e.g., one or more interface devices 406). The interface device 406 can include one or more communication chips, connectors, and/or other hardware and software to govern communications between the computing device 400 and other computing devices. For example, the interface device 406 can include circuitry for managing wireless communications for the transfer of data to and from the computing device 400. The term "wireless" and its derivatives can be used to describe circuits, devices, systems, methods, techniques, communications channels, etc., that can communicate data through the use of modulated electromagnetic radiation through a nonsolid medium. The term does not imply that the associated devices do not contain any wires, although in one or more embodiments the associated devices might not contain any wires. Circuitry included in the interface device 406 for managing wireless communications can implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). In one or more embodiments, circuitry included in the interface device 406 for managing wireless communications can operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In one or more embodiments, circuitry included in the interface device 406 for managing wireless communications can operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In one or more embodiments, circuitry included in the interface device 406 for managing wireless communications can operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In one or more embodiments, the interface device 406 can include one or more antennas (e.g., one or more antenna arrays) to receipt and/or transmission of wireless communications.

In one or more embodiments, the interface device 406 can include circuitry for managing wired communications, such as electrical, optical, or any other suitable communication protocols. For example, the interface device 406 can include circuitry to support communications in accordance with Ethernet technologies. In one or more embodiments, the interface device 406 can support both wireless and wired communication, and/or can support multiple wired communication protocols and/or multiple wireless communication protocols. For example, a first set of circuitry of the interface device 406 can be dedicated to shorter-range wireless communications such as Wi-Fi or Bluetooth, and a second set of circuitry of the interface device 406 can be dedicated to longer-range wireless communications such as global positioning system (GPS), EDGE, GPRS, CDMA, WIMAX, LTE, EV-DO, or others. In one or more embodiments, a first set of circuitry of the interface device 406 can be dedicated to wireless communications, and a second set of circuitry of the interface device 406 can be dedicated to wired communications.

The computing device 400 can include battery/power circuitry 408. The battery/power circuitry 408 can include one or more energy storage devices (e.g., batteries or capacitors) and/or circuitry for coupling components of the computing device 400 to an energy source separate from the computing device 400 (e.g., AC line power).

The computing device 400 can include a display device 410 (e.g., multiple display devices). The display device 410 can include any visual indicators, such as a heads-up display, a computer monitor, a projector, a touchscreen display, a liquid crystal display (LCD), a light-emitting diode display, or a flat panel display.

The computing device 400 can include other input/output (I/O) devices 412. The other I/O devices 412 can include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 400, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 400 can have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra mobile personal computer, etc.), a desktop computing device, or a server computing device or other networked computing component.

Figure 5:
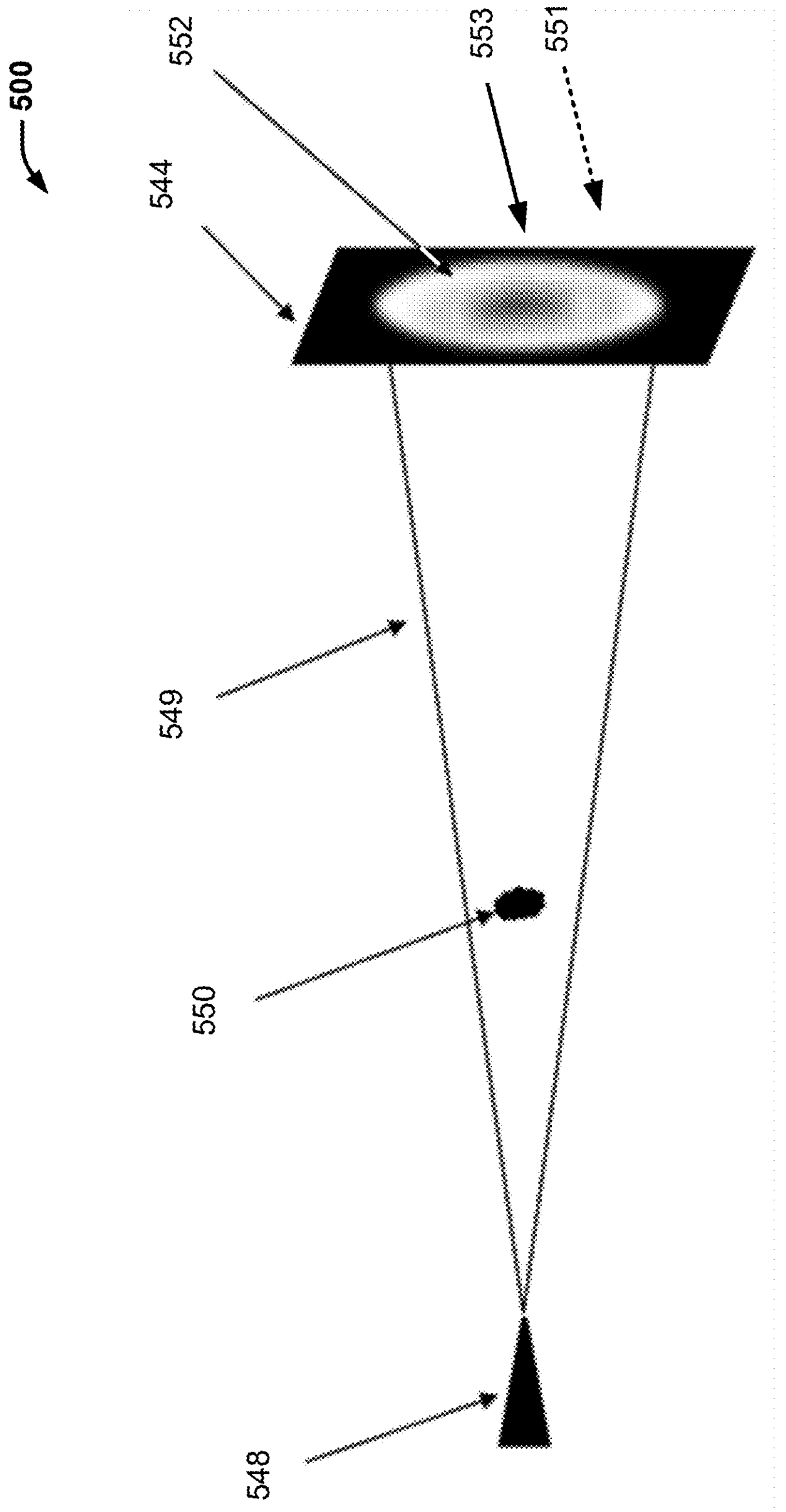
FIG. 5 illustrates a schematic diagram of an image generation device, in accordance with one or more embodiments described herein.
Figure 6:
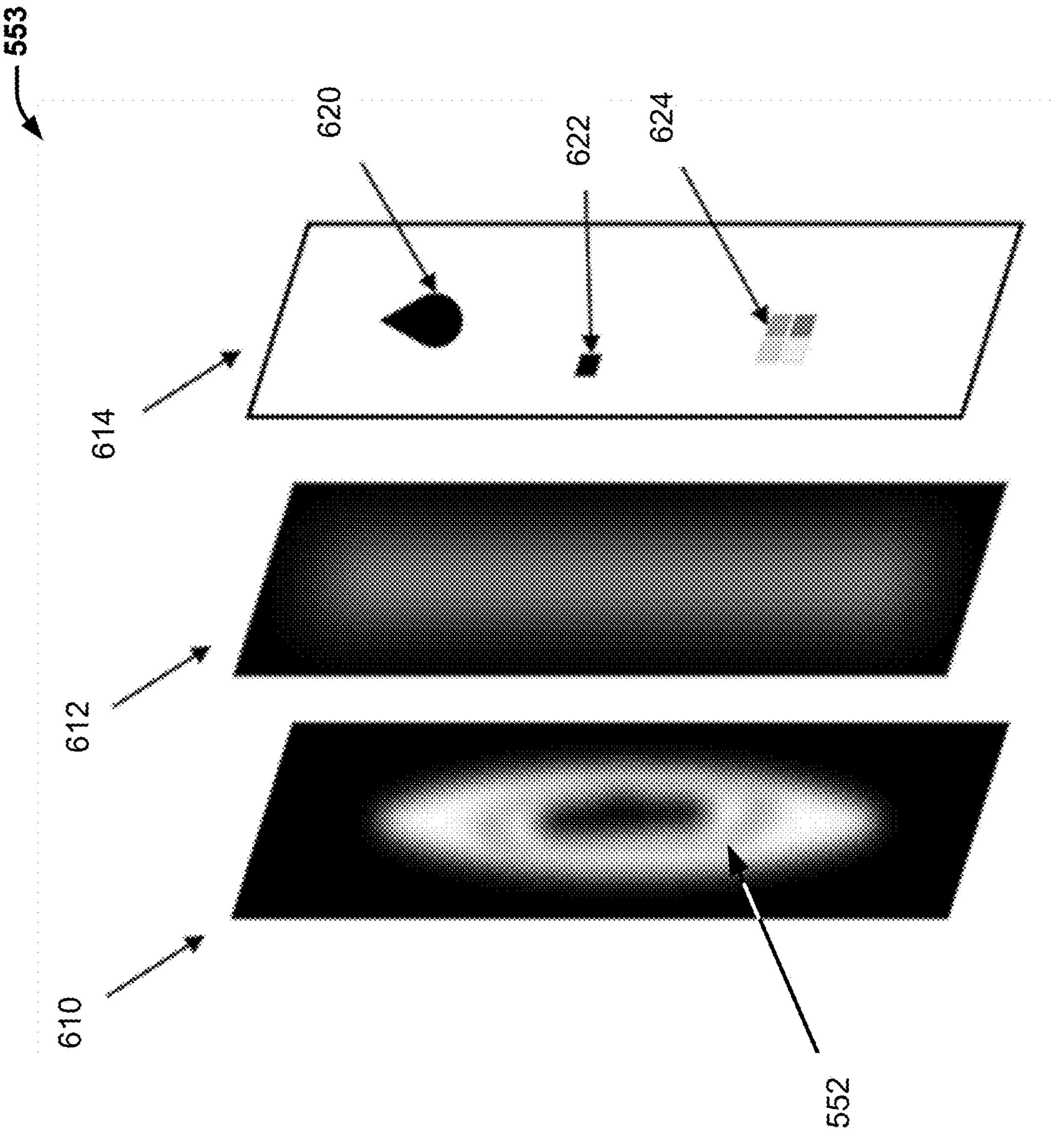
FIG. 6 illustrates a schematic break down of an original image, in accordance with one or more embodiments described herein.
Figure 7:
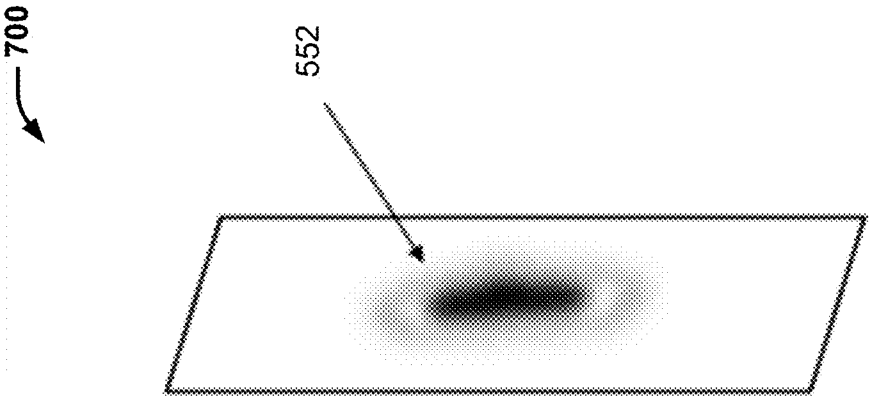
FIG. 7 illustrates a depiction of an ideal image, in accordance with one or more embodiments described herein.

Referring next to FIGS. 5 to 7, illustrated is an imaging device (e.g., an electron application device 500) at FIG. 5 and one or more schematic depictions of original images 553 (at FIGS. 6 and 7) that can be generated by the electron application device 500.

As illustrated at FIG. 5, an electron application device 500 or other imaging device can comprise an energy source, such as an electron source 548, a sample 550 or other target or target composition, and a detector 544, such as an electron detector. It is noted that a distance between any of the object 550, the emitter 548 (e.g., electron source 548) and the detector 544 can be exaggerated at FIG. 5 for illustration purposes. The electron source 548 can generate an electron projection path 549 causing an image signal 551 to be produced as a result of interaction of electrons from the electron source 548 at the detector 544. An image produced can comprise an original image 553 comprising a projected hologram image 552 of the sample 550.

As schematically depicted at FIG. 6, showing a virtual breakdown of the original image, the original image 553 can comprise image contamination caused by device contamination and/or detector contamination. For example, the original image 553 is schematically broken down for ease of reference into a portion 610 comprising the hologram of the projected object 552, which falls on a pixelated detector surface of the detector 544. Portion 612 represents an ambient signal from other sources in the environment about and/or within the imaging device 500, such as within a chamber of the imaging device 500. Portion 612 is not the hologram, but rather is background noise. Portion 614 can comprise a schematic representation of the image contaminations including the detector contamination 620 (e.g., a contamination on a detector surface blocking low energy electrons from the electron source 548, without being limited thereto), a detector imperfection 622 such as a malfunctioning pixel in the detector 544, and/or areas of uneven sensor sensitivity 624 (e.g., caused by an imaging system having an uneven sensitivity to a uniform electron beam form the electron source 548).

As illustrated at FIG. 7, alternatively, a perfect ideal original image 700 would comprise only the hologram of the projected object 552 (e.g., the image of the sample 550).

Figure 8:
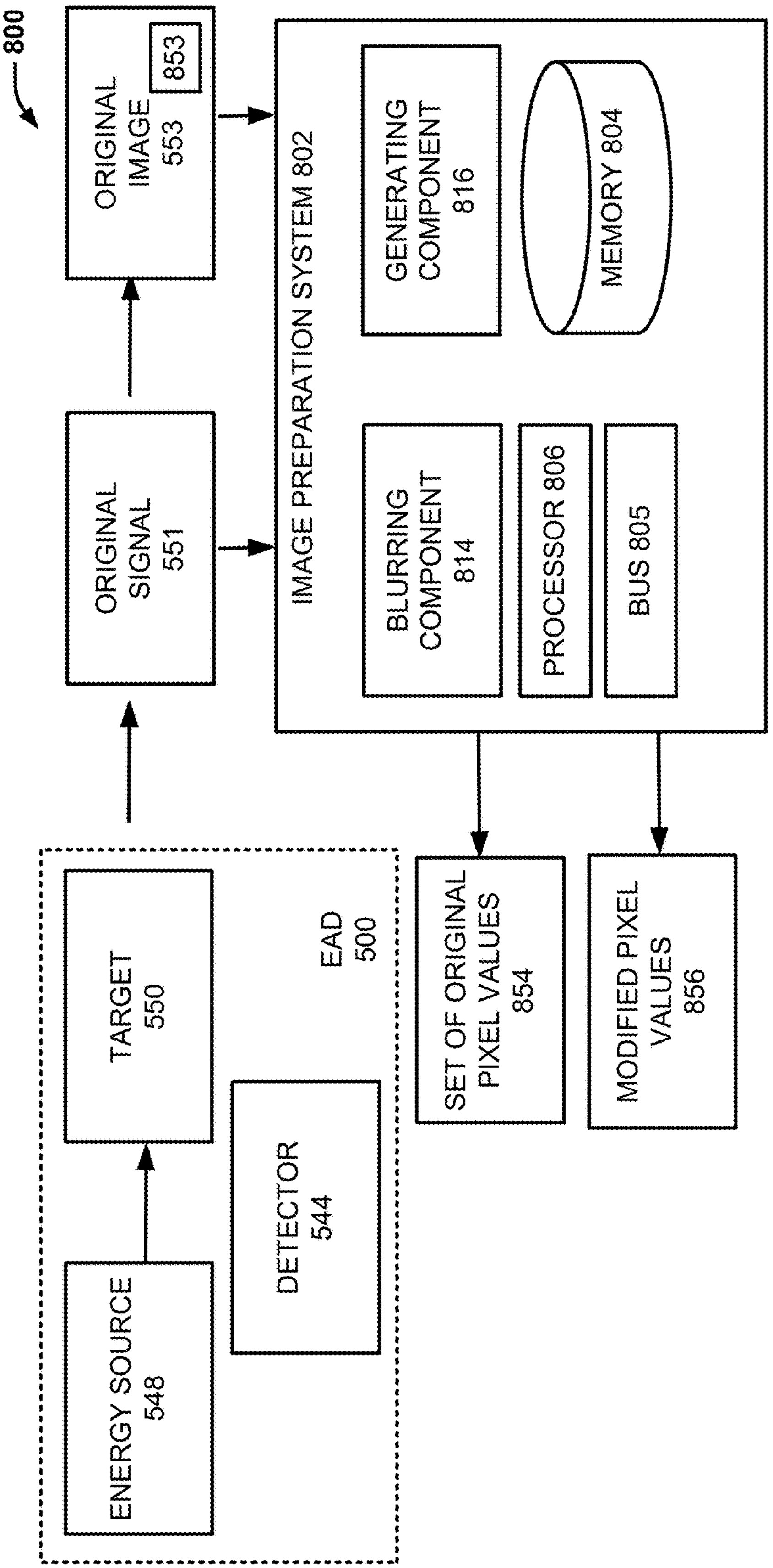
FIG. 8 illustrates a block diagram of an example, non-limiting system that can facilitate a process for electron holography image background extraction, in accordance with one or more embodiments described herein.
Figure 9:
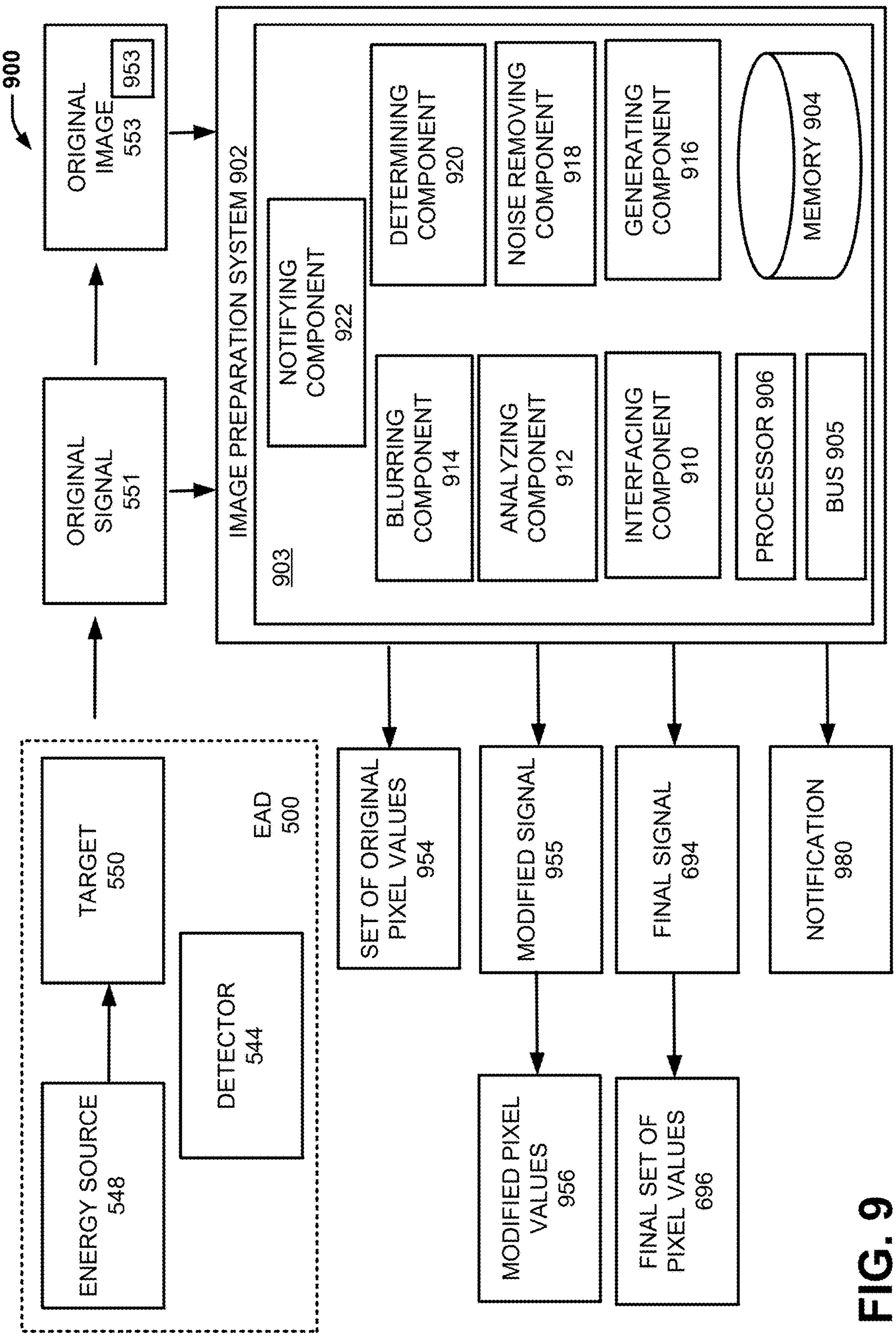
FIG. 9 illustrates a block diagram of another example, non-limiting system that can facilitate a process for electron holography image background extraction, in accordance with one or more embodiments described herein.
Figure 23:
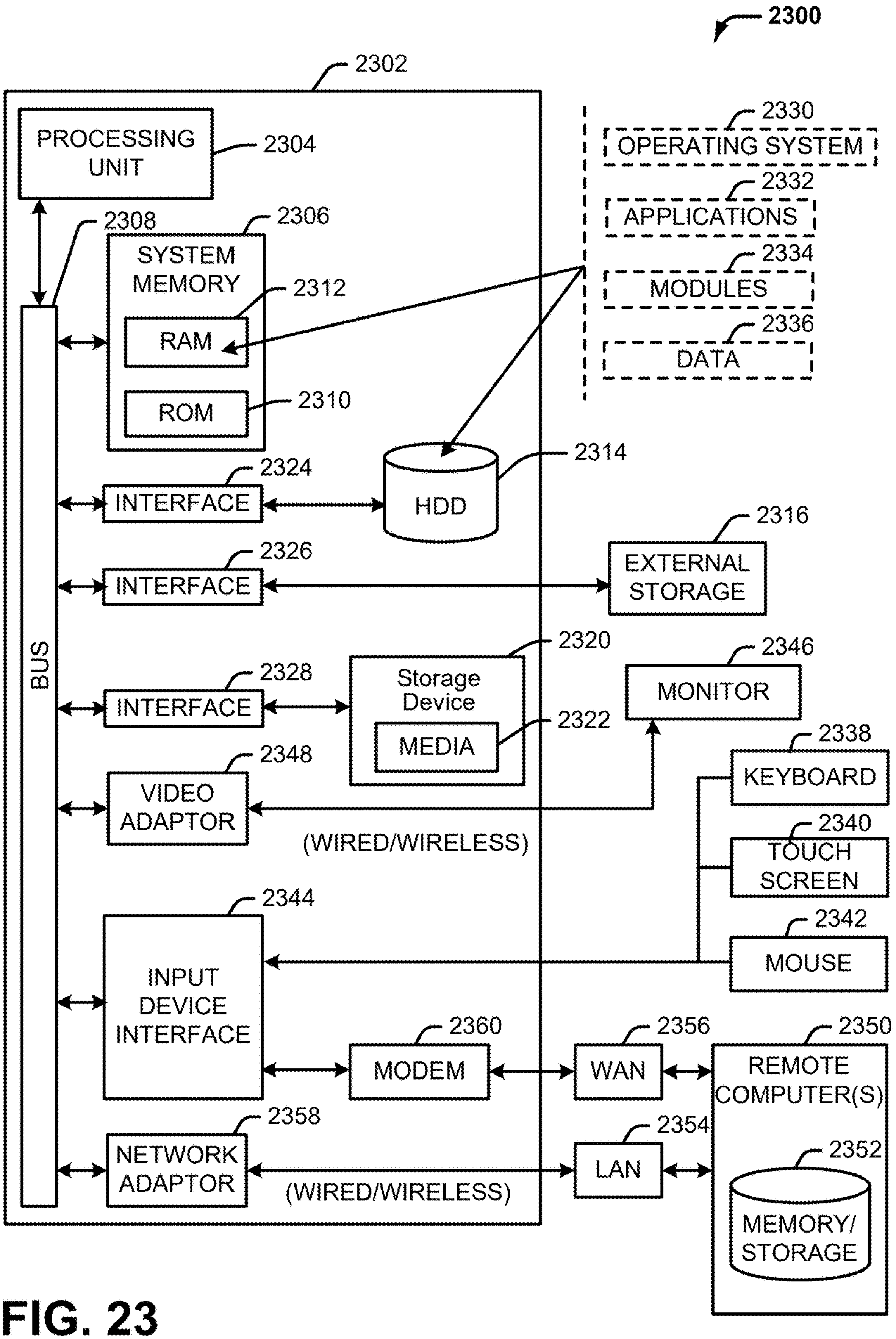
FIG. 23 illustrates an example schematic block diagram of a computing environment with which the subject matter described herein can interact and/or be implemented at least in part.

Referring next to FIGS. 8 and 9, in one or more embodiments, the non-limiting systems 800 and/or 900 illustrated at FIGS. 8 and 9, and/or systems thereof, can further comprise one or more computer and/or computing-based elements described herein with reference to a computing environment, such as the computing environment 2300 illustrated at FIG. 23. In one or more described embodiments, computer and/or computing-based elements can be used in connection with implementing one or more of the systems, devices, components and/or computer-implemented operations shown and/or described in connection with FIGS. 8 and/or 9 and/or with other figures described herein.

Turning first to FIG. 8, the figure illustrates a block diagram of an example, non-limiting system 800 that can comprise an image preparation system 802 and an electron application device (EAD) 500. The image preparation system 802 can facilitate a process for electron holography image background extraction of an original signal 551/original image 553, based on output from the electron application device 500. The non-limiting system 800 can be employed in connection with a holography system, such as an in-line electron or laser holography system, such as comprising the EAD 500.

In one or more embodiments, the image preparation system 802 can be at least partially comprised by the computing device 400.

In one or more embodiments, the image preparation system 902 can at least partially comprise the energy application device 500 and/or vice versa.

It is noted that the image preparation system 802 is only briefly detailed to provide but a lead-in to a more complex and/or more expansive image preparation system 902 as illustrated at FIG. 9. That is, further detail regarding processes that can be performed by one or more embodiments described herein will be provided below relative to the non-limiting system 900 of FIG. 9.

Still referring to FIG. 8, the image preparation system 802 can comprise at least a memory 804, bus 805, processor 806, blurring component 814, and generating component 816. The processor 806 can be the same as the processor 402, comprised by the processor 402 or different therefrom. The memory 804 can be the same as the storage device 404, comprised by the storage device 404 or different therefrom.

Using the above-noted components, the image preparation system 802 can facilitate a process to at least partially modify the original image 553 to at least partially reduce image contamination/areas of uneven sensor sensitivity 620, 622 and/or 624 corresponding to the original image 553. Likewise, the process can at least partially modify the original signal 551 to at least partially reduce image contamination/areas of uneven sensor sensitivity 620, 622 and/or 624 corresponding to the original signal 551.

Generally, the blurring component 814 can execute a primary blurring action and a secondary blurring action on the original electron holography (EH) image 553 characterized by a set of pixels 853 having a set of original pixel values 854. The pixel values can comprise color values and/or luminosity values, without being limited thereto.

In one or more embodiments, the blurring component 814 can perform a determination of whether a set of first pixel values resulting from the primary blurring action are modified relative to the set of original pixel values 854. If no, the non-limiting system 800 can proceed to re-execute the primary blurring action. If yes, the non-limiting system 800 can proceed.

Based on the primary blurring action and secondary blurring action, the generating component 816 can generate a set of modified pixel values 856, for the set of pixels 853, based on a difference of a set of first pixel values, of the set of pixels 853, resulting from the primary blurring action and a set of second pixel values, of the set of pixels 853, resulting from the secondary blurring action.

As a result of these components, a reduction in image contamination can be facilitated, which reduction can be pixel-by-pixel based, as will described below in greater detail relative to FIG. 9.

The blurring component 814 and generating component 816 can be operatively coupled to the processor 806 which can be operatively coupled to the memory 804. The bus 805 can provide for the operative coupling. The processor 806 can facilitate execution of the blurring component 814 and generating component 816. The blurring component 814 and generating component 816 can be stored at the memory 804.

In general, the non-limiting system 800 can employ any suitable method of communication (e.g., electronic, communicative, internet, infrared, fiber, etc.) to provide communication between the image preparation system 802, the electron application device 500 and/or any device associated with a user entity.

Turning next to FIG. 9, a non-limiting system 900 is illustrated that can comprise an image preparation system 902 and electron application device 500. Repetitive description of like elements and/or processes employed in respective embodiments is omitted for sake of brevity. Description relative to an embodiment of FIG. 8 can be applicable to an embodiment of FIG. 9. Likewise, description relative to an embodiment of FIG. 9 can be applicable to an embodiment of FIG. 8.

Generally, the image preparation system 902 can facilitate a process for electron holography image background extraction of an original signal 551/original image 553, based on output from the electron application device 500. The non-limiting system 900 can be employed in connection with a holography system, such as an in-line electron or laser holography system comprising the electron application device 500.

In one or more embodiments, the image preparation system 902 can be at least partially comprised by the computing device 400.

In one or more embodiments, the image preparation system 902 can at least partially comprise the energy application device 646.

In one or more embodiments, the energy application device 646 can be comprised by a holography system, such as an in-line electron or laser holography system.

The energy application device 646, such as an electron energy application device 646, can comprise any suitable processor or memory for facilitating one or more processes including, but not limited to, securement of a target 650, application of an energy stream from an energy source 648 to the target 650, generation of an initial energy-based hologram 652 from an original signal 651 resulting from the application of the energy stream, and/or detection of the original hologram 652.

One or more communications between one or more components of the non-limiting system 600 can be provided by wired and/or wireless means including, but not limited to, employing a cellular network, a wide area network (WAN) (e.g., the Internet), and/or a local area network (LAN). Suitable wired or wireless technologies for supporting the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (lpv6 over Low power Wireless Area Networks), Z-Wave, an advanced and/or adaptive network technology (ANT), an ultra-wideband (UWB) standard protocol and/or other proprietary and/or non-proprietary communication protocols.

Figure 22:
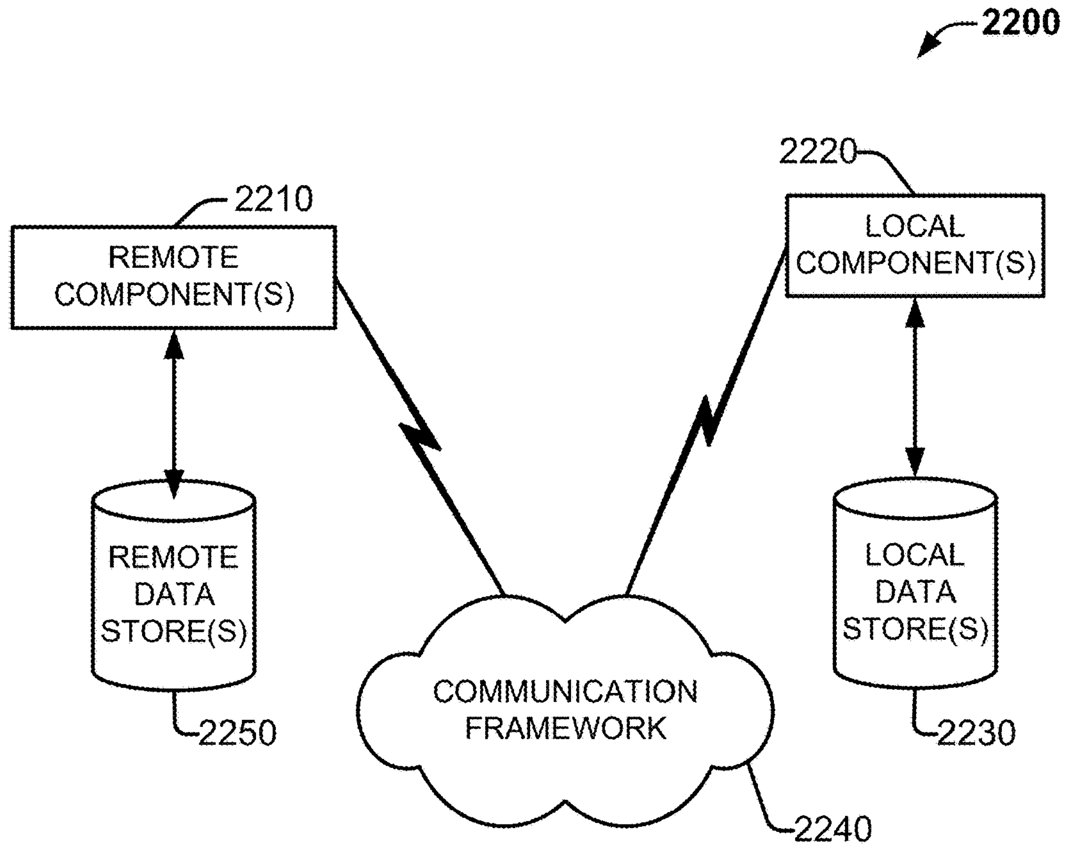
FIG. 22 illustrates a block diagram of an example operating environment into which embodiments of the subject matter described herein can be incorporated.

The image preparation system 902 can be associated with, such as accessible via, a cloud computing environment, such as the cloud computing environment 2200 of FIG. 22.

The image preparation system 902 can comprise a plurality of components. The components can comprise a memory 904, processor 906, bus 905, interfacing component 910, analyzing component 912, blurring component 914, generating component 916, noise removing component 918, determining component 920 and/or notifying component 922. Using these components, the image preparation system 902 can output at least a modified signal 955 having modified pixel values 956.

Discussion next turns to the processor 906, memory 904 and bus 905 of the image preparation system 902. For example, in one or more embodiments, the image preparation system 902 can comprise the processor 906 (e.g., computer processing unit, microprocessor, classical processor, quantum processor and/or like processor). In one or more embodiments, a component associated with image preparation system 902, as described herein with or without reference to the one or more figures of the one or more embodiments, can comprise one or more computer and/or machine readable, writable and/or executable components and/or instructions that can be executed by processor 906 to provide performance of one or more processes defined by such component and/or instruction. In one or more embodiments, the processor 906 can comprise the interfacing component 910, analyzing component 912, blurring component 914, generating component 916, noise removing component 918, determining component 920 and/or notifying component 922.

In one or more embodiments, the image preparation system 902 can comprise the computer-readable memory 904 that can be operably connected to the processor 906. The memory 904 can store computer-executable instructions that, upon execution by the processor 906, can cause the processor 906 and/or one or more other components of the image preparation system 902 (e.g., interfacing component 910, analyzing component 912, blurring component 914, generating component 916, noise removing component 918, determining component 920 and/or notifying component 922) to perform one or more actions. In one or more embodiments, the memory 904 can store computer-executable components (e.g., interfacing component 910, analyzing component 912, blurring component 914, generating component 916, noise removing component 918, determining component 920 and/or notifying component 922).

The image preparation system 902 and/or a component thereof as described herein, can be communicatively, electrically, operatively, optically and/or otherwise coupled to one another via a bus 905. Bus 905 can comprise one or more of a memory bus, memory controller, peripheral bus, external bus, local bus, quantum bus and/or another type of bus that can employ one or more bus architectures. One or more of these examples of bus 905 can be employed.

In one or more embodiments, the image preparation system 902 can be coupled (e.g., communicatively, electrically, operatively, optically and/or like function) to one or more external systems (e.g., a non-illustrated electrical output production system, one or more output targets and/or an output target controller), sources and/or devices (e.g., classical and/or quantum computing devices, communication devices and/or like devices), such as via a network. In one or more embodiments, one or more of the components of the image preparation system 902 and/or of the non-limiting system 600 can reside in the cloud, and/or can reside locally in a local computing environment (e.g., at a specified location).

In addition to the processor 906 and/or memory 904 described above, the image preparation system 902 can comprise one or more computer and/or machine readable, writable and/or executable components and/or instructions that, when executed by processor 906, can provide performance of one or more operations defined by such component and/or instruction.

Discussion next turns to the additional components of the image preparation system 902 (e.g., interfacing component 910, analyzing component 912, blurring component 914, generating component 916, noise removing component 918, determining component 920 and/or notifying component 922), generally, the image preparation system 902 can perform a set of processes that can be separated into various steps comprising, but not limited to: physical blurring, digital blurring, modified pixel value generation and/or notifying using a notification 980.

First, it is noted that in one or more embodiments, the interfacing component 910, analyzing component 912, blurring component 914, generating component 916, noise removing component 918, determining component 920 and/or notifying component 922 can be implemented independently, without one or more other of the interfacing component 910, analyzing component 912, blurring component 914, generating component 916, noise removing component 918, determining component 920 and/or notifying component 922. Additionally and/or alternatively, the interfacing component 910, analyzing component 912, blurring component 914, generating component 916, noise removing component 918, determining component 920 and/or notifying component 922 can be comprised by a high-level monitoring component 903, one or more of the below-described functions of the interfacing component 910, analyzing component 912, blurring component 914, generating component 916, noise removing component 918, determining component 920 and/or notifying component 922 can be performed by the high-level monitoring component 903, and/or the interfacing component 910, analyzing component 912, blurring component 914, generating component 916, noise removing component 918, determining component 920 and/or notifying component 922 can be omitted with the high-level monitoring component 903 performing one or more of the below-described functions of the one or more omitted interfacing component 910, analyzing component 912, blurring component 914, generating component 916, noise removing component 918, determining component 920 and/or notifying component 922.

Turning then to the original signal acquisition and original hologram expansion, detail will be provided regarding the interfacing component 910.

Turning first to the interfacing component 910, this component can generally acquire the original signal 551. The original signal 551 can originate from and/or be caused by the energy application device 500. That is, the original signal 551 can be a result of application of an energy stream by the energy source 548 to the target 550, where the energy source can be an electron energy source generating an electron beam and/or stream. In one or more embodiments, the target 550 can be secured by the electron application device 500.

Figure 10:
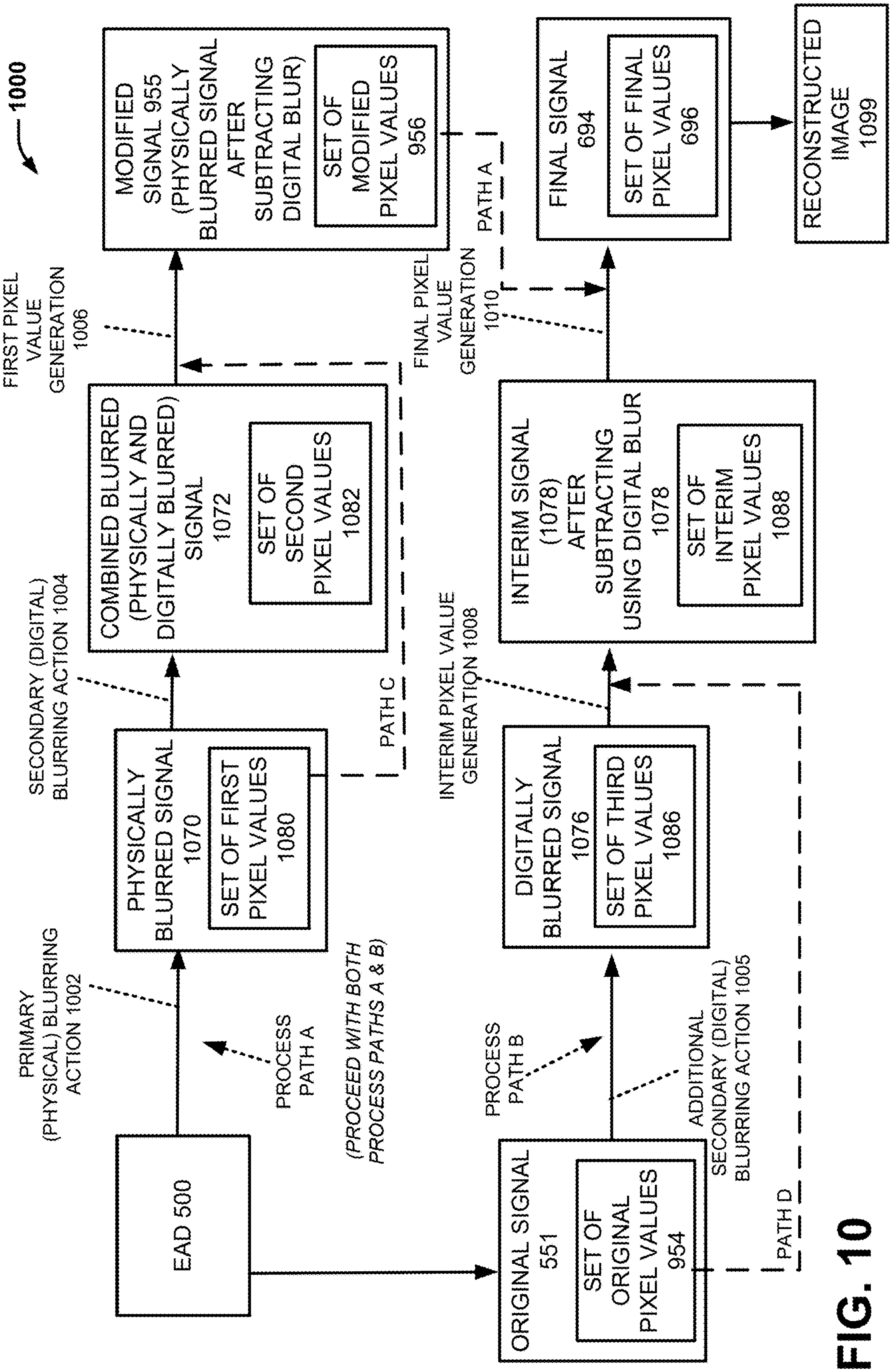
FIG. 10 provides a schematic block diagram depicting a process flow that can be performed by the image preparation system of FIG. 9, in accordance with one or more embodiments described herein.
Figure 11:
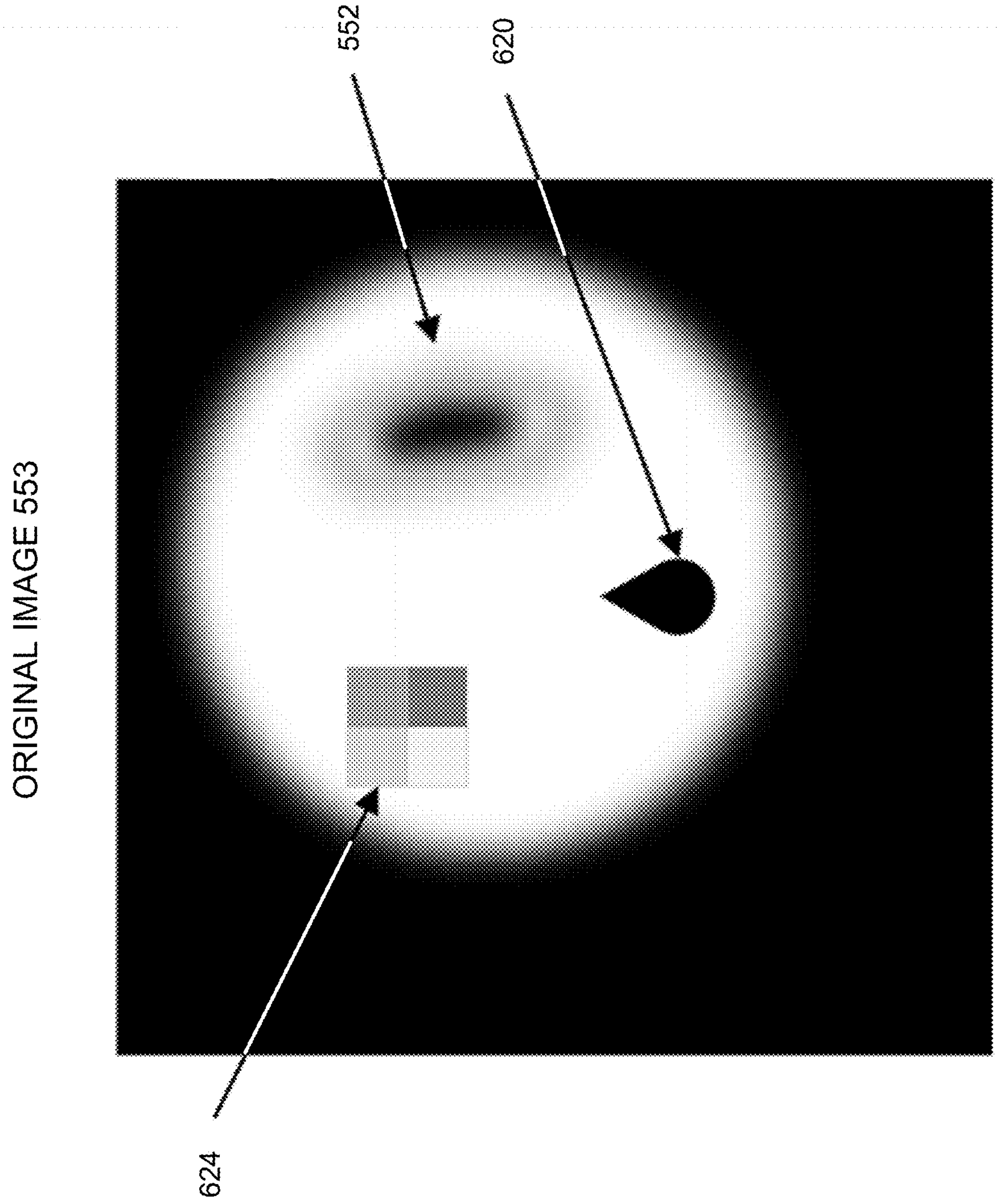
FIG. 11 illustrates a schematic depiction of an image that can be generated based on one or more processes that can be performed by the image preparation system of FIG. 9, in accordance with one or more embodiments described herein.

Turning briefly to schematic 1000 of FIG. 10 and to the original image depiction at FIG. 11, based on the acquired original signal 551, the initial energy-based hologram 553 can be generated (e.g., a conventional hologram generation process), such as by the energy application device 500 (e.g., by the energy source 548).

The original hologram 553, as illustrated at FIG. 11, can have image contamination associated therewith. This image contamination can comprise detector contamination 620 (e.g., a contamination on a detector surface blocking low energy electrons from the electron source 548, without being limited thereto), a detector imperfection (not shown) such as a malfunctioning pixel in the detector 544, and/or areas of uneven sensor sensitivity 624 (e.g., caused by an imaging system having an uneven sensitivity to a uniform electron beam form the electron source 548).

Accordingly, it can be desired to reduce and/or altogether remove such image contamination, which removal can be difficult, inefficient, manually intensive and/or inaccurate using existing approaches.

Instead, the image preparation system 902 can execute two or more blurring processes that can reduce and/or eliminate such image contamination.

For example, referring still to FIGS. 9 and 10, the analyzing component 912 can measure, analyze and/or otherwise evaluate the original signal 551 and/or original image 553 to determine a set of original pixel values 954 for the set of pixels of the original image 553 corresponding to the pixelated detector 544. In one or more embodiments, for example, the analyzing component 912 can employ a pixelated detector (e.g., of the detector 544) that is sensitive to particles emitted (e.g., electrons). In one or more embodiments, for another example, the analyzing component 912 can employ a scintillator and/or an optical camera, where the optical camera is sensitive to a wavelength produced by the scintillator. The set of original pixel values 954 can comprise contrast data, luminosity (e.g., brightness) data and/or color data, without being limited thereto. It is noted that such description can apply to any one or more additional and/or all pixel values discussed herein (e.g., sets of pixel values 1080, 1082, 1086, 1088, 956 and/or 696).

In one or more embodiments, based on the original pixel values 954 and/or based on the original image 553, the image preparation system 902 and/or an administrating entity (e.g., using the device 400) can trigger an image preparation process employing the image preparation system 902, as will be described below. Additionally, and/or alternatively, in one or more embodiments, execution of the image preparation process can be automatic and/or default.

Figure 12:
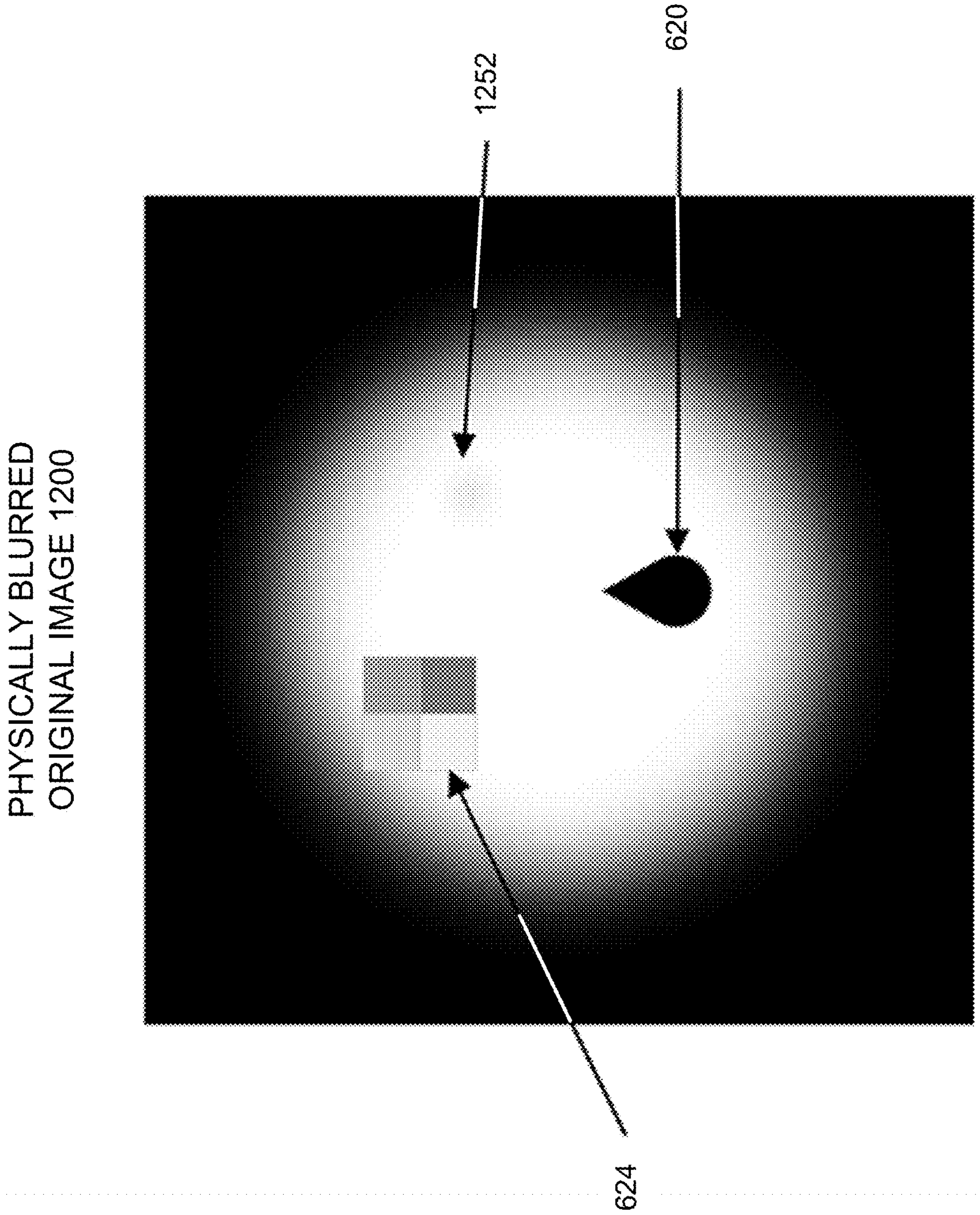
FIG. 12 illustrates a schematic depiction of an image that can be generated based on one or more processes that can be performed by the image preparation system of FIG. 9, in accordance with one or more embodiments described herein.

Now also referring to FIG. 12, using the acquired signal 551/original image 553, the blurring component 914 can perform a primary blurring action 1002, which can be a physical blurring action.

As used herein, "blurring" can refer to the distortion or reduction in clarity of breaks, such as linear breaks, between aspects of a hologram. This reduction in clarity can be caused by a shifting or change in pixel values of the hologram away from natural color and/or luminosity values, among other factors, to shifted color and/or luminosity values. Depending on the ideal or default pixel values closest to that of the real-world target being imaged, a default pixel value can be lighter, darker, grayer, among other factors. A blurred set of pixels can instead have color and/or luminosity values that are non-characteristic, e.g., shifted, from color and/or luminosity of aspects of the target corresponding to the blurred set of pixels.

In one or more embodiments, the blurring can cause one or more aspects of a target hologram to be represented by an increased pixel count in addition to and/or in alternative to color and/or luminosity value shifting. That is, a first aspect of a target hologram can blend into a second aspect of the target hologram, such as where the first aspect and the second aspect share pixels that otherwise, without blurring, would belong to the first aspect, the second aspect, or neither of the first and the second aspect. For example, a hologram of a non-blurred cell wall can be 3 pixels wide at a particular level of magnification. Differently, at the same level of magnification, a blurred call wall can be 3 or more pixels wide. To describe this difference in a 1-pixel-wide cell wall as compared to a 3-pixel-wide cell wall, it can be described that the 3 pixels have altered color and/or luminosity values as compared to the pixels of the non-blurred cell wall (e.g., a 1-pixel wide cell wall). Here, altered color can be represented in grayscale or black pixel coloring as compared to white pixel coloring, or vice versa.

Additionally, and/or alternatively, in one or more embodiments, values of one or more pixels can be shifted. For example, a set of three pixels corresponding to a non-blurred cell wall can have non-blurred color and/or luminosity values and be disposed at a set of corresponding pixel locations. After blurring, a set of pixel values corresponding to the three pixels can be spaced apart from one another and/or otherwise shifted across a pixel map of the image. Thus, after blurring the same set of pixel values can correspond to different pixel locations of the pixel map.

In one or more embodiments, the blurring can occur on a pixel-by-pixel basis. Additionally, and/or alternatively, blurring can occur for one or more groups of two or more pixels, where a pair of groups can share at least one pixel, in some embodiments, or can share no pixels, in other embodiments.

Additionally, and/or alternatively, blurring can result in loss of color comprising shifting in pixel color values closer to a background color, whether being white, gray and/or black, thus causing increased indistinguishability between pixels corresponding to a target hologram and pixels corresponding to a background disposed about the target hologram.

As described herein, at least two types of blurring are employed by the image preparation system 902, and thus by the non-limiting system 900. These are physical blurring and digital blurring, although in other embodiments, one or more other types of blurring can be employed where suitable. Furthermore, these blurring techniques can be employed, relative to the image preparation system 902, in combination, whether being performed separately or at the same time as one another.

Here, relative to FIG. 12 (e.g., as a precursor to generation of image 1200/signal 1070), physical blurring can be employed for the primary blurring action 1002. As described above, a physical blurring action can comprise use of a vibration, such as a mechanically-induced and/or electrically-induced vibration of a sensor of the detector 544 or of the chamber of the imaging device 500 while an image of the target sample 550 is being captured. For example, a fan, such as a cooling fan for cooling a column generating the electron beam, can be operated while using the detector 544 to capture the original image 553/original signal 551. That is, such fan can be typically non-operated during image capture to avoid such vibration and intentional blurring. In one or more embodiments, the blurring component 914 can cause and/or direct the operation of such fan or other vibration-causing device. Additionally, and/or alternatively, in one or more embodiments, fast alternating electromagnetic field can be operated on an electron path 549 of an electron beam of the imaging device 500. In one or more embodiments, the blurring component 914 can cause and/or direct the operation of a device generating an alternating electromagnetic field.

It is noted that physical blurring actions are not limited to the one or more steps described above. Rather, one or more of the steps can be omitted, changed and/or replaced and/or one or more additional steps can be added. That is, physical blurring actions are not limited to vibration-based and/or alternating electromagnetic field-based actions, wherein suitable.

As a result of the physical blurring action 1002, any one or more of the above-described pixel-related results can be caused.

Also, as a result of the physical blurring action 1002, a physically blurred signal 1070/physically blurred image 1200 can be generated. As with the description above, the generation can comprise image and/or signal capture, readying, analyzing and/or the like. As illustrated at FIG. 12, the physically blurred image 1200 can comprise detector contamination 620, areas of uneven sensor sensitivity 624 and a hologram 1252 of the sample 550, which hologram can be nearly disappeared due to the physical blurring. It is noted that one or more processes now to be described can recover this hologram 1252 of the sample 550 while also at least partially reducing and/or removing the image contamination.

Figure 13:
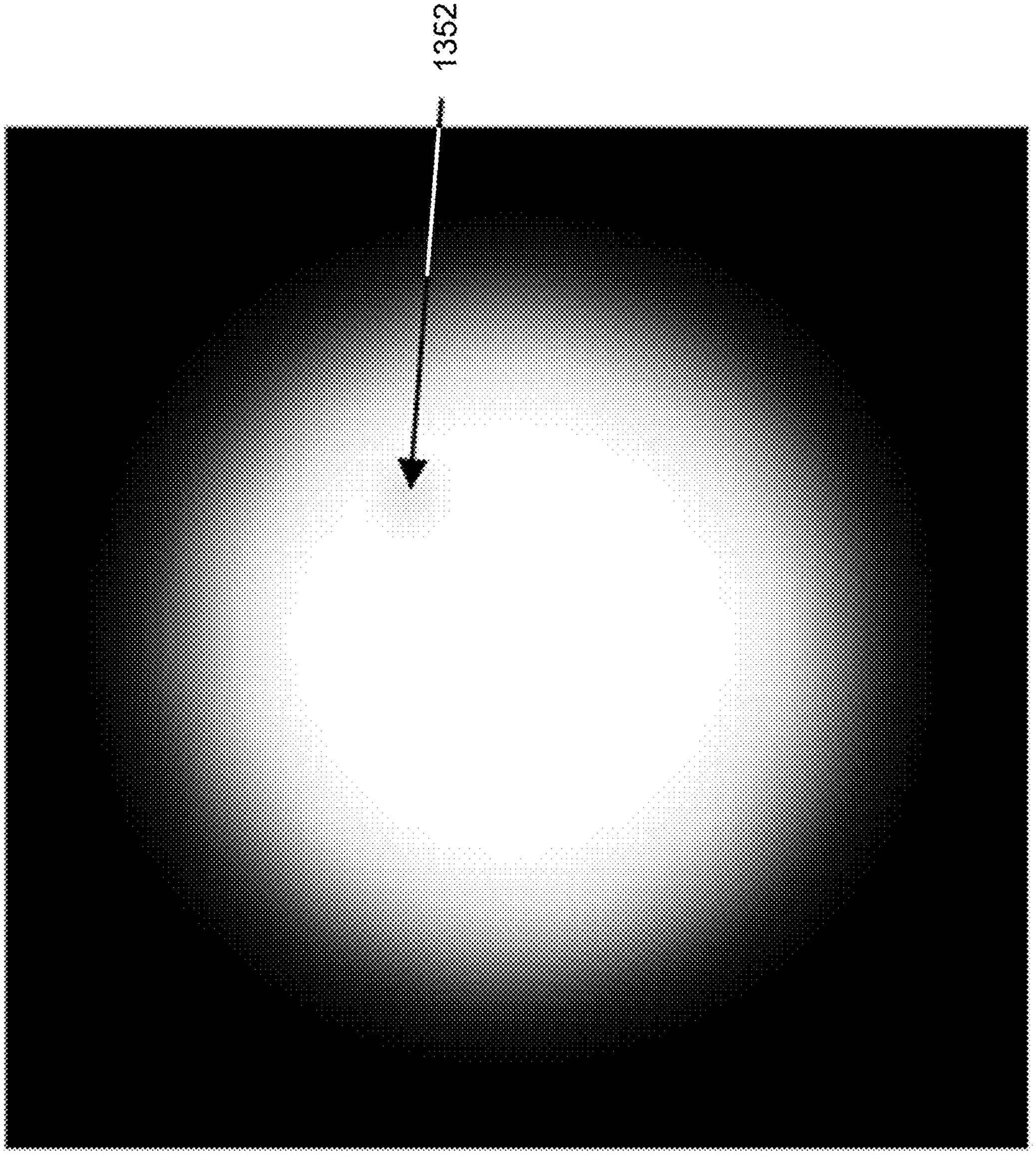
FIG. 13 illustrates a depiction of an image that can be generated based on one or more processes that can be performed by the image preparation system of FIG. 9, in accordance with one or more embodiments described herein.

Turning now to FIG. 13, and still to FIGS. 9 and 10, using the physically blurred signal 1070/physically blurred image 1200, the blurring component 914 can perform a secondary blurring action 1004, which can be a digital blurring action. As described above, a digital blurring action, such as a Gaussian blurring action or a box filter blurring action, can comprise application of a mathematical function to data defining the physically blurred signal 1070/physically blurred image 1200, such as to pixel values thereof (e.g., to a set of first pixel values 1080), to thereby further blur the image. As a result of the digital blurring action 1004, any one or more of the above-described pixel-related results can be caused by the application of the mathematical function.

As another result, the one or more frameworks described herein can employ at least a combined blurring approach for electron holography image background extraction.

That is, as a result of the digital blurring action 1004, a combined blurred signal 1072/combined blurred image 1300 can be generated. Put another way, the image 1300 can be a digitally blurred physically blurred image 1300 (e.g., a digital blurring of physical blurring or, put another way, mathematical function-based blurring of vibration-based or electromagnetic field-based blurring).

It is noted that digital blurring actions are not limited to the one or more steps described above. Rather, one or more of the steps can be omitted, changed and/or replaced and/or one or more additional steps can be added. That is, digital blurring actions are not limited only to use of Gaussian-based mathematical functions, wherein suitable.

As with the description above, the generation can comprise image and/or signal capture, readying, analyzing and/or the like. As illustrated at FIG. 13, the combined blurred image 1300 can be blurred to an extent that a majority of sensor contamination (e.g., comprise detector contamination 620 and/or areas of uneven sensor sensitivity 624) can be removed, while even further removing and/or disappearing the hologram 1252 of the sample 550 to a state of the hologram 1352, which hologram can be even further disappeared due to the combination of the physical blurring and digital blurring of the physical blurring.

Figure 14:
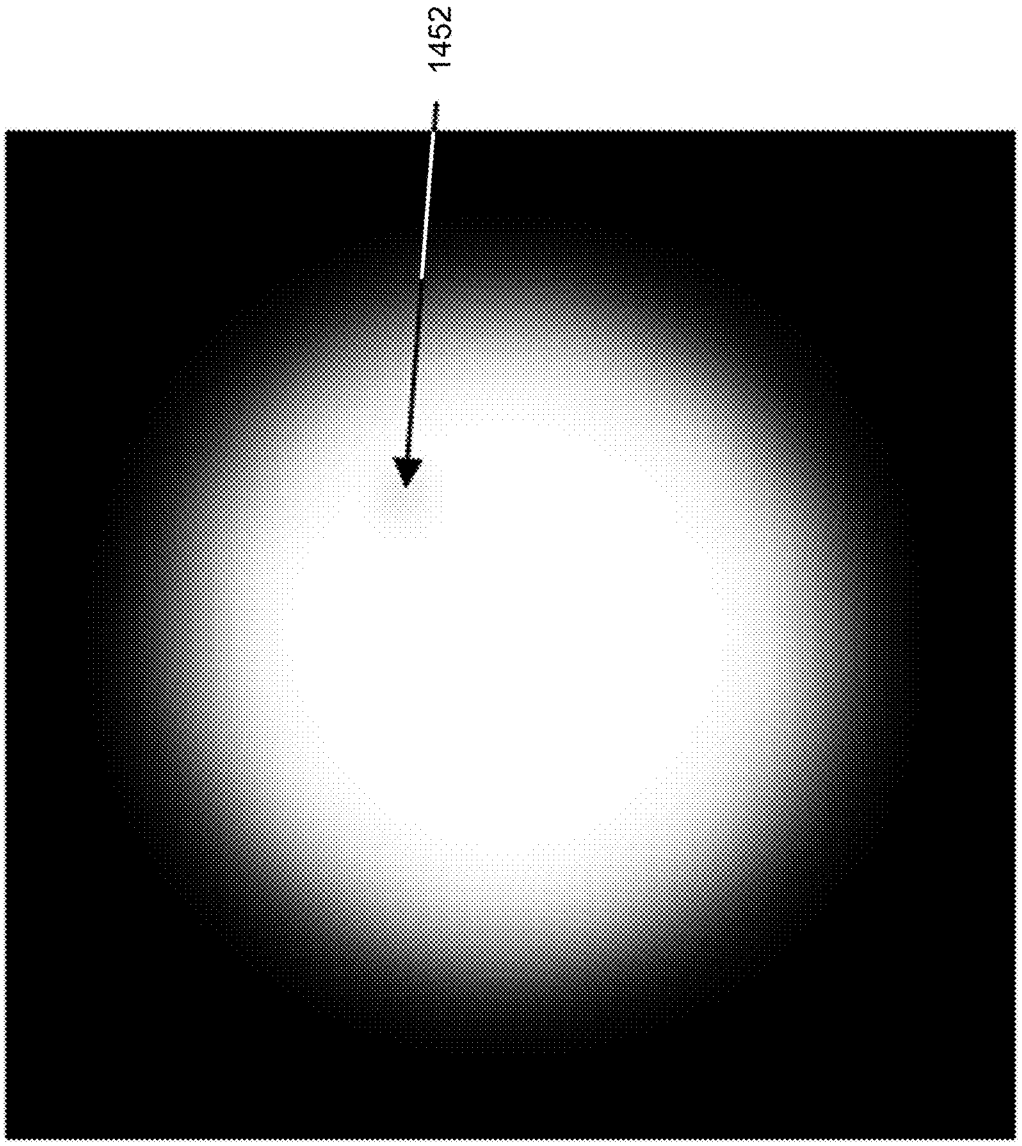
FIG. 14 illustrates a depiction of an image that can be generated based on one or more processes that can be performed by the image preparation system of FIG. 9, in accordance with one or more embodiments described herein.

Turning next to FIG. 14, and still to FIGS. 9 and 10, using the acquired signal 551/original image 553, the blurring component 914 can perform an additional secondary blurring action 1005, which again can be a digital blurring action. Description above relative to the secondary blurring action 1004 is also applicable to the additional secondary blurring action 1005. This additional digital blurring action 1005, however, can be executed relative to the acquired original signal 551/original image 553, thus resulting in a digitally blurred signal 1076/digitally blurred original image 1400. Briefly, as illustrated at FIG. 10, it is noted that this second and parallel operation path will be employed to generate a final image 1700/final signal 694 and/or to perform final pixel value generation 1010.

Referring now again to the analyzing component 912, this component can generally measure, analyze and/or otherwise evaluate the digitally blurred signal 1076/digitally blurred original image 1400 to determine a set of third pixel values 1086 for the set of pixels of the digitally blurred signal 1076/digitally blurred original image 1400.

Next, the generating component 916 can generate a set of interim pixel values 1088, for the set of pixels 953, based on a difference of the set of original pixel values 954, of the set of pixels 953, and the set of third pixel values 1086, of the set of pixels 953, resulting from the additional secondary blurring action 1005. In one or more embodiments, this interim pixel value generation 1008 can comprise subtracting the set of third pixel values 1086 from the set of original pixel values 954 (e.g., employing path D of FIG. 10) to thereby remove general effect of the additional digital blurring action 1004. Put another way very generally, this step can comprise subtracting the digitally blurred image 1400 (FIG. 14) from the original (raw) image 553 (FIG. 11).

It is noted that executing and removing the digital blurring is not merely comparative to adding pixel values of X and also removing said same pixel values of X. Rather, due to the effect of the digital blurring, the pixel values removed at the interim pixel value generation 1008 are different than, and thus are not the same as, the pixel value difference caused by the additional digital blurring action 1005.

Figure 15:
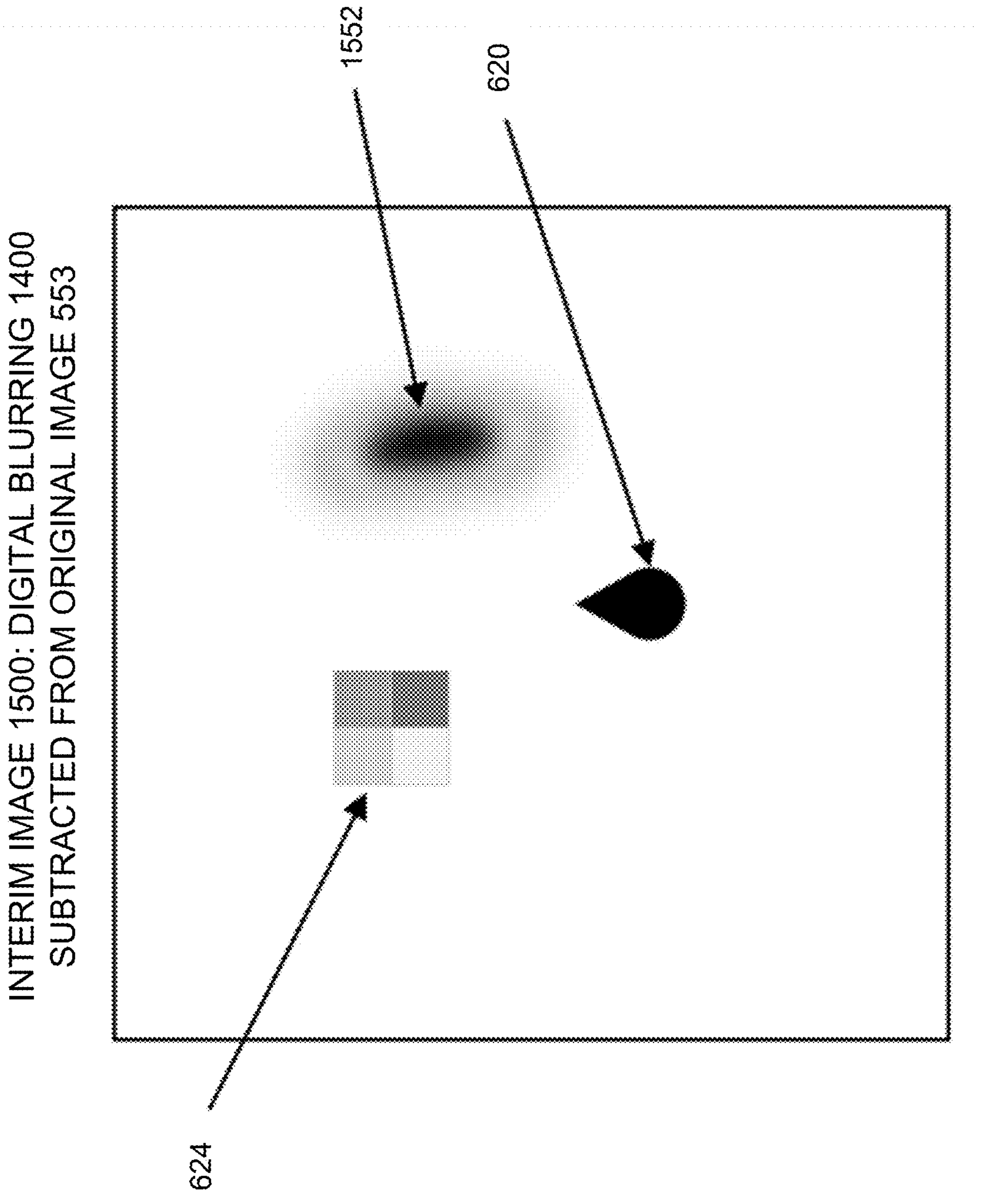
FIG. 15 illustrates a schematic depiction of an image that can be generated based on one or more processes that can be performed by the image preparation system of FIG. 9, in accordance with one or more embodiments described herein.

As a result, turning now to FIG. 15, and still to FIGS. 9 and 10, as a result of the interim pixel value generation 1008, an interim image 1500/interim signal 1078 can be generated by the generating component 916. As illustrated, the interim image 1500 can be based on removal of digital blurring effects and can compromise detector contamination 620, areas of uneven sensor sensitivity 624 and a hologram 1552 of the sample 550, which hologram can have a higher visibility level than the hologram 1252 (FIG. 12) due to the physical blurring corresponding to FIG. 12 and the hologram 1252. However, additional steps based on additional blurring can allow for bringing back the hologram of the sample 550 while also reducing and/or removing the image contamination/areas of uneven sensor sensitivity (620, 624).

Figure 16:
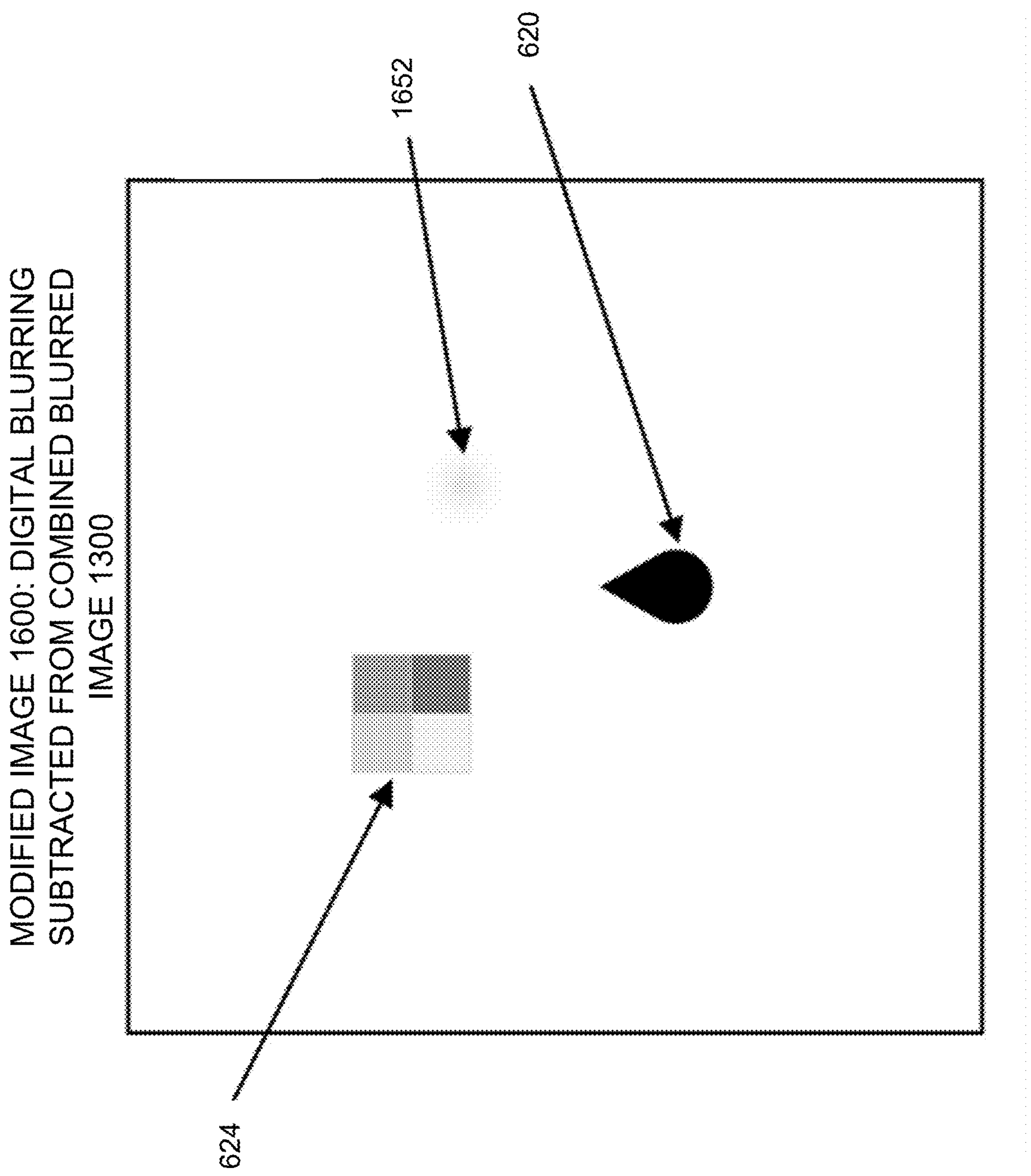
FIG. 16 illustrates a schematic depiction of an image that can be generated based on one or more processes that can be performed by the image preparation system of FIG. 9, in accordance with one or more embodiments described herein.

Turning again only to FIG. 13 and FIG. 15 as brief visual references, and then also to FIG. 16, based on the combined blurred signal 1072/combined blurred image 1300, and also on the interim signal 1078/interim image 1500, a modified signal 955/modified image 1600 can be generated by the generating component 916.

That is, more particularly, referring again to the analyzing component 912, this component can generally measure, analyze and/or otherwise evaluate the physically blurred signal 1070/physically blurred original image 1200 to determine the set of first pixel values 1080, for the set of pixels 953, corresponding to FIG. 12. Likewise, the analyzing component 912 also can generally measure, analyze and/or otherwise evaluate the combined blurred signal 1072/combined blurred original image 1300 to determine the set of second (combined blurred) pixel values 1082, for the set of pixels 953, corresponding to FIG. 13.

Based on these steps, the generating component 916 can perform a first pixel value generation 1006 (FIG. 10) to generate a set of modified pixel values 956, for the set of pixels 953, based on a difference of the set of first pixel values 1080, resulting from the primary (physical) blurring action 1002, and the set of second pixel values 1082, resulting from the secondary (digital) blurring action 1004. For example, the set of first pixel values 1080 can be subtracted from the set of second pixel values 1082, thereby providing an effect of removal of digital blur effect. Put another way very generally, this step can comprise subtracting the digitally blurred physically blurred image 1300 (FIG. 13) from the physically blurred image 1200 (FIG. 12).

As a result, turning to FIG. 16, the modified image 1600/modified signal 654 can be generated by the generating component 916. Thereby, the one or more frameworks discussed here can employ both a physical blurring and a combined blurring (digitally blurred physical blurring) to at least partially achieve the extraction of electron holography image background contamination/noise.

As illustrated, the modified image 1600 can be based on removal of digital blurring effects and can compromise detector contamination 620, areas of uneven sensor sensitivity 624 and a hologram 1652 of the sample 550, which hologram still can be nearly disappeared due to the physical blurring and/or combined blurring have been performed. However, additional steps based on additional blurring can allow for bringing back the hologram of the sample 550 while also reducing and/or removing the image contamination/areas of uneven sensor sensitivity (620, 624).

Referring now again to the analyzing component 912, and still to FIGS. 10 and 16, this component can generally measure, analyze and/or otherwise evaluate the modified signal 955/modified image 1600 to determine the set of modified pixel values 956. Additionally, and/or alternatively, the set of modified pixel values 956 can be obtained from the generating component 916 as being the set of pixels generated by the first pixel value generation 1006 upon which the generation of the modified signal 955/modified image 1600 was based.

Figure 17:
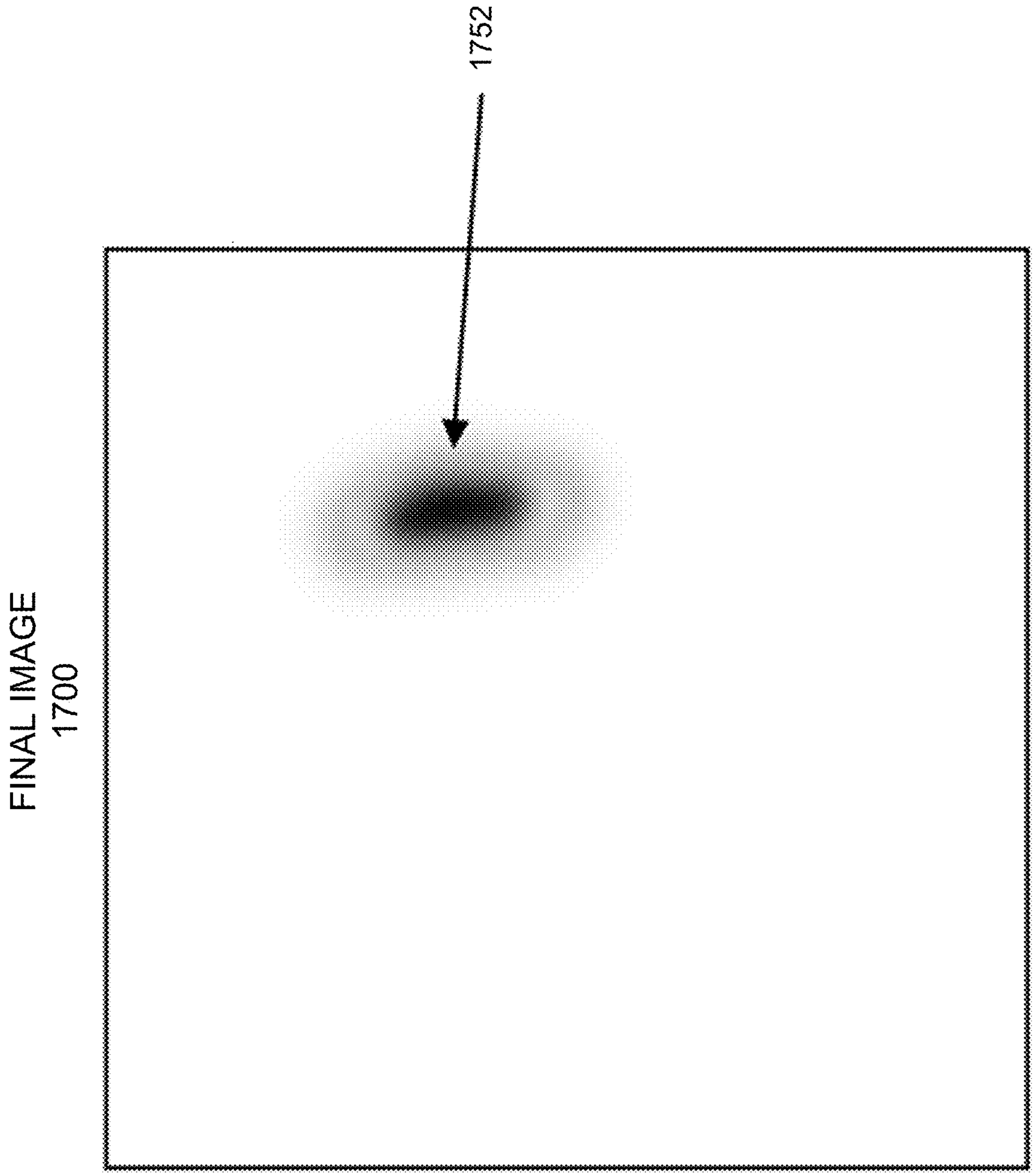
FIG. 17 illustrates a depiction of an image that can be generated based on one or more processes that can be performed by the image preparation system of FIG. 9, in accordance with one or more embodiments described herein.

Next, attention is directed to FIG. 17, in addition still to FIG. 10. FIG. 17 illustrates a final image 1700 corresponding to a final signal 694 and a set of final pixel values 696 upon which a reconstruction of the hologram 552 (e.g., a reconstructed image 1099) can be generated/reconstructed with higher quality that is possible by existing frameworks.

That is, the generating component 916 can perform a final pixel value generation 1010 to generate the set of final pixel values 696, for the set of pixels 953, based on a difference of the set of interim pixel values 1088, resulting from the interim pixel value generation 1008 and the set of modified pixel values 956, resulting from the fixt pixel value generation 1006. For example, the set of modified pixel values 956 can be subtracted from the set of interim pixel values 1088, thereby providing an effect of removal of physical blur effect. (It is noted that effect of digital blur effect was already provided by both the first pixel value generation 1006 and by the interim pixel value generation 1008.)

Put another way very generally, this step can comprise subtracting the image produced (e.g., modified image 1600) by processing the physically and digitally blurred image from the image produced (e.g., interim image 1500) by processing the digitally blurred only image. Put still another way, this step can comprise use of a first result of combined physical and digital image blurring and use of a second result of digital-only image blurring. Thereby, the one or more frameworks discussed here can employ three set of blurring, e.g., a physical blurring, a digital blurring, and a combined blurring (digitally blurred physical blurring), to at least partially achieve the extraction of electron holography image background contamination/noise from an original/raw hologram image.

As a result, looking to FIG. 17, the final image 1700/final signal 694 can be generated by the generating component 916 based on the set of final pixel values 696 resulting from the final pixel value generation 1010.

As illustrated, the final image 1700 can be based on removal of both digital blurring effects and physical blurring effects and can compromise reduced and/or no detector contamination 620 and/or areas of uneven sensor sensitivity 624. Further the final image 1700 can comprise a final hologram 1752 of the sample 550, which hologram is not nearly non-visible and which has a higher quality than can result from existing frameworks, from physical blurring alone, from digital blurring alone, or from basic combined digital blurring of physical blurring.

Indeed, instead, the higher quality can result from a particular aggregation discussed herein of all of digital-only blurring, physical-only blurring, and combined digital blurring of physical blurring.

Further it is noted that emission patterns for different images or different blurrings can be different. This is yet another effect unable to be overcome by existing approaches and which is overcome by the subject matter discussed herein through the particular aggregation discussed herein of all of digital-only blurring, physical-only blurring and combined digital blurring of physical blurring.

It also is noted that images, as illustrated at any one or more of FIGS. 11-16, need not be generated. Rather the processes described above can be based merely on the signals and/or on the sets of pixel values alone resulting from the various blurring actions and/or pixel value generations described above.

Referring now to FIG. 9 again and to the noise removing component 918, in one or more embodiments, generates a set of noise-reduced pixel values, for the set of pixels, based on a difference in a set of noisy pixel values, for the set of pixels, and a set of ambient pixel values, for the set of pixels, obtained from an image capture without generation of any of an electron beam, other emission and/or physical blurring action. Thus, the ambient pixel values represent the level of environmental noise (e.g., in an environment around the EAD 500). That is, in any one or more of the above-noted image preparation processes related to FIGS. 11-17, a blurred set of pixel values (whether digitally-blurred, physically-blurred or both) for each process can be the noisy pixel values, and prior to other processes relating to the pixel values being performed, the set of ambient pixel values can be removed from (e.g., subtracted from) the noisy pixel values. This can result in a set of noise-reduced pixel values having had environmental noise removed therefrom.

Referring still to FIG. 9 and to the determining component 920, this component can perform a determination that a resultant image based on a set of modified pixel values comprises a reduced level of contamination as compared to an original level of contamination of the original EH image 553. The modified pixel values can be any pixel values different from the original pixel values 954. The resultant image can be any one or more of the images of FIGS. 11-17.

Referring still to FIG. 9 and to the notifying component 922, this component can generate a notification 98—corresponding to the determination that an image (e.g., a resultant image) based on the set of modified pixel values comprises a reduced level of contamination as compared to an original level of contamination of the original EH image 553. The notification 980 can be sent to, made available to, obtained by and/or received by the display device 410, for example.

Figure 18:
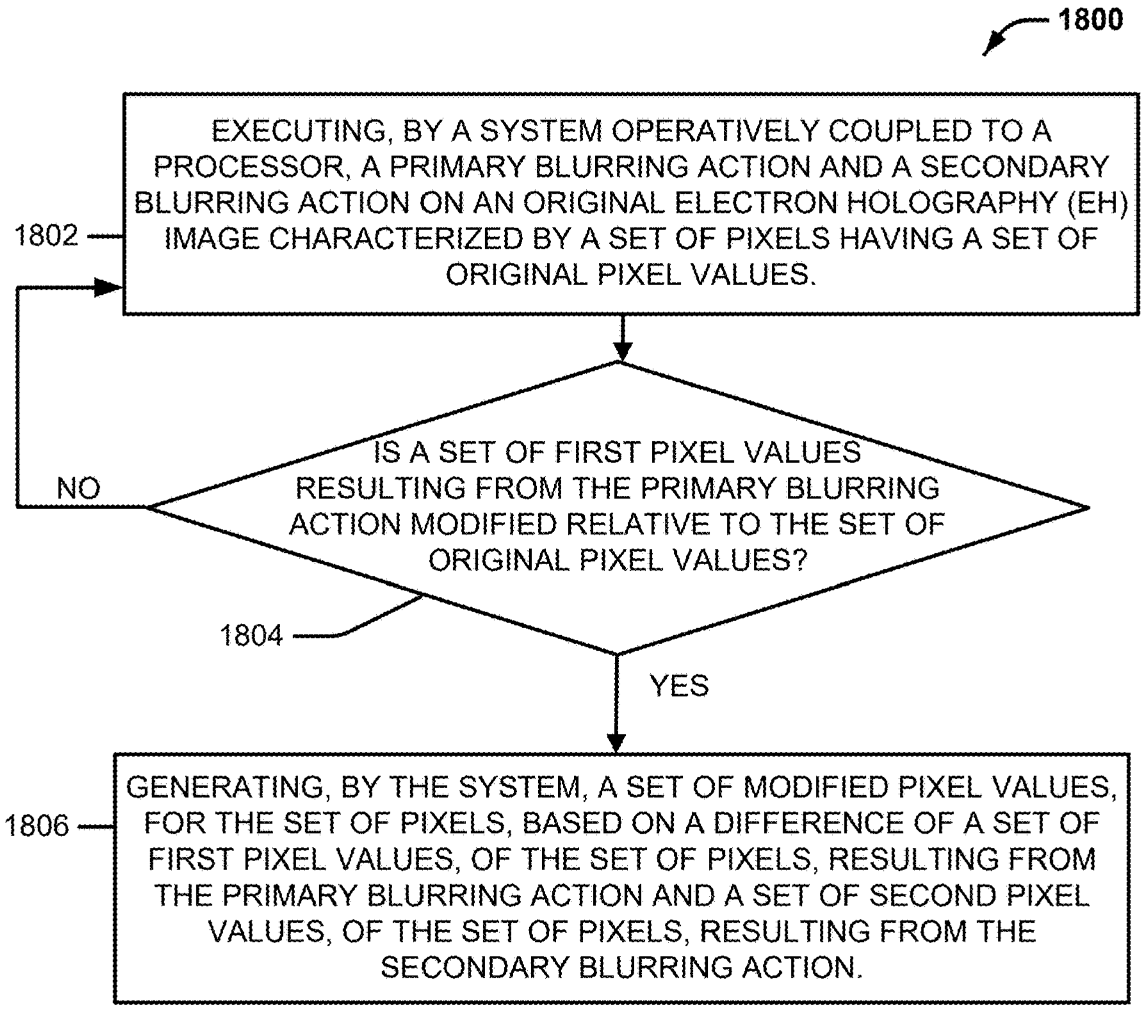
FIG. 18 illustrates a flow diagram of one or more processes that can be performed by the image preparation system of FIG. 9, in accordance with one or more embodiments described herein.

As a summary of the above-described components and functions thereof, referring next to FIG. 18, illustrated is a flow diagram of an example, non-limiting method 1800 that can facilitate a process for electron holography image background extraction (e.g., image contamination reduction and/or removal), in accordance with one or more embodiments described herein, such as the non-limiting system 900 of FIG. 9. While the non-limiting method 1800 is described relative to the non-limiting system 900 of FIG. 9, the non-limiting method 1800 can be applicable also to other systems described herein, such as the non-limiting system 800 of FIG. 8. Repetitive description of like elements and/or processes employed in respective embodiments is omitted for sake of brevity.

At 1802, the non-limiting method 1800 can comprise executing, by a system (e.g., blurring component 914 operatively coupled to a processor (e.g., processor 906), a primary blurring action (e.g., primary blurring action 1002), and a secondary blurring action (e.g., secondary blurring action 1004) on an original electron holography (EH) image (e.g., original image 553) characterized by a set of pixels having a set of original pixel values (e.g., set of original pixel values 954).

At 1804, the non-limiting method 1800 can comprise determining, by the system (e.g., blurring component 914), if a set of first pixel values resulting from the primary blurring action are modified relative to the set of original pixel values. If no, the non-limiting method 1800 can proceed back to step 1802 for re-executing the primary blurring action. If yes, the non-limiting method 1800 can proceed forward to step 1806.

At 1806, the non-limiting method 1800 can comprise generating, by the system (e.g., generating component 916), a set of modified pixel values (e.g., modified pixel values 956), for the set of pixels, based on a difference of a set of first pixel values, of the set of pixels, resulting from the employing of the distortion technique and a set of second pixel values, of the set of pixels, resulting from the applying of the secondary blurring action.

Figure 19:
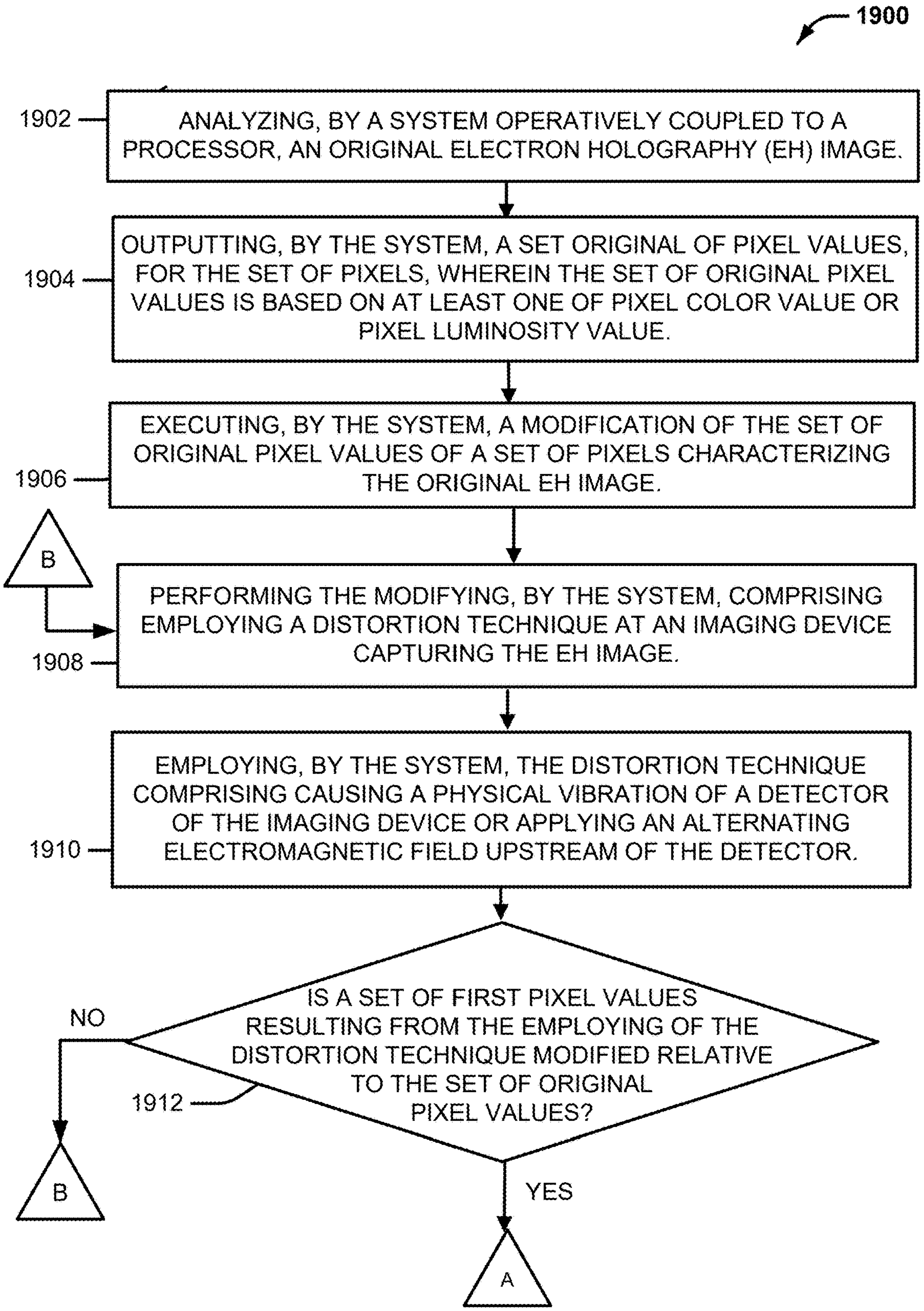
FIG. 19 illustrates another flow diagram of one or more processes that can be performed by the image preparation system of FIG. 9, in accordance with one or more embodiments described herein.
Figure 20:
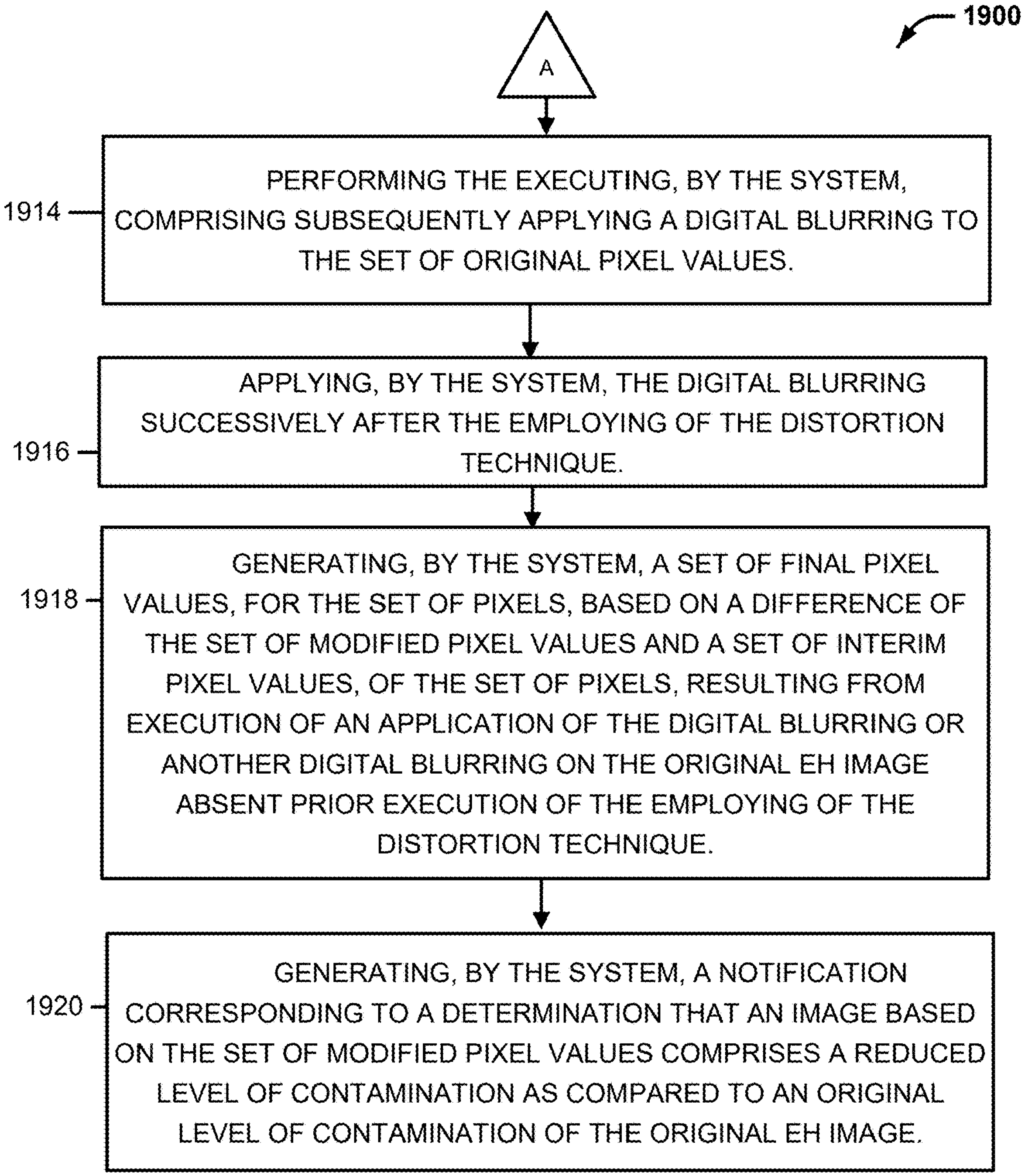
FIG. 20 illustrates a continuation of the flow diagram of FIG. 19 of one or more processes that can be performed by the image preparation system of FIG. 9, in accordance with one or more embodiments described herein.

As another summary of the above-described components and functions thereof, referring next to FIGS. 19 and 20, illustrated is a flow diagram of an example, non-limiting method 1900 that can facilitate a process for electron holography image background extraction (e.g., image contamination reduction and/or removal), in accordance with one or more embodiments described herein, such as the non-limiting system 900 of FIG. 9. While the non-limiting method 1900 is described relative to the non-limiting system 900 of FIG. 9, the non-limiting method 1900 can be applicable also to other systems described herein, such as the non-limiting system 800 of FIG. 8. Repetitive description of like elements and/or processes employed in respective embodiments is omitted for sake of brevity.

At 1902, the non-limiting method 1900 can comprise analyzing, by a system (e.g., interfacing component 910) operatively coupled to a processor (e.g., processor 906), an original electron holography (EH) image (e.g., original image 553).

At 1904, the non-limiting method 1900 can comprise outputting, by the system (e.g., interfacing component 910), a set original of pixel values (e.g., set of original pixel values 954), for the set of pixels, wherein the set of original pixel values is based on at least one of pixel color value or pixel luminosity value.

At 1906, the non-limiting method 1900 can comprise executing, by the system (e.g., blurring component 914), a modification of the set of original pixel values of a set of pixels characterizing the original EH image.

At 1908, the non-limiting method 1900 can comprise performing the executing, by the system (e.g., blurring component 914), comprising employing a distortion technique at an imaging device (e.g., EAD 500) capturing the EH image.

At 1910, the non-limiting method 1900 can comprise employing, by the system (e.g., blurring component 914), the distortion technique comprising causing a physical vibration of a detector (e.g., detector 544) of the imaging device or applying an alternating electromagnetic field upstream of the detector.

At 1912, the non-limiting method 1900 can comprise determining, by the system (e.g., analyzing component 912), if a set of first pixel values (e.g., set of first pixel values 1080) resulting from employing of the distortion technique are modified relative to the set of original pixel values. If no, the non-limiting method 1900 can proceed back to step 1908 for re-employing the distortion technique. If yes, the non-limiting method 1900 can proceed forward to step 1914.

At 1914, the non-limiting method 1900 can comprise performing the executing, by the system (e.g., blurring component 914), comprising subsequently applying a digital blurring to the set of original pixel values.

At 1916, the non-limiting method 1900 can comprise applying, by the system (e.g., blurring component 914), the digital blurring successively after the employing of the distortion technique.

At 1918, the non-limiting method 1900 can comprise generating, by the system (e.g., generating component 916), a set of final pixel values (e.g., final set of pixel values 696), for the set of pixels, based on a difference of a set of modified pixel values (e.g., modified pixel values 956) and a set of interim pixel values (e.g., set of interim pixel values 1088), of the set of pixels, resulting from execution of an application of the digital blurring or another digital blurring on the original EH image absent prior execution of the employing of the distortion technique.

At 1920, the non-limiting method 1900 can comprise generating, by the system (e.g., notifying component 922), a notification (e.g., notification 980) corresponding to a determination that an image based on the set of modified pixel values comprises a reduced level of contamination as compared to an original level of contamination of the original EH image.

Additional Summary

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more systems, computer program products and/or computer-implemented methods provided herein relate to a process for electron holography image background extraction. A system can comprise a memory that stores, and a processor that executes, computer executable components. The computer executable components can comprise a blurring component that executes a primary blurring action and a secondary blurring action on an original electron holography (EH) image characterized by a set of pixels having a set of original pixel values, and a generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

The one or more embodiments disclosed herein can achieve improved performance relative to existing approaches. For example, based at least on application of a pair of blurring executions to an original image (also herein referred to as a raw image) output from an energy-based hologram imaging device, image contamination can be reduced to a level much lower than is possible using existing approaches. The image contamination reduction can comprise reduction of detector imperfections, sensor contamination, ambient noise, malfunctioning pixels and/or other detector imperfection effects. Accordingly, preparation of an electron holography (EH) signal upon which a reconstructed image is based can be more efficient and more aggressively reduce such image contamination as compared to existing approaches.

The one or more embodiments described herein can be implemented within, in connection with and/or coupled to an electron holography (EH) imaging device, such as the imaging system 500 generically illustrated at FIG. 5.

As a result of use of the one or more embodiments described herein, image contamination can be removed from a background of a hologram, thus improving quality of a subsequent hologram reconstruction based on an output of the one or more embodiments described herein.

Indeed, in view of the one or more embodiments described herein, a practical application of the one or more systems, computer-implemented methods and/or computer program products described herein can be ability to provide both noise subtraction and emission pattern subtraction without resultingly interfering with one another and/or failing to remove the other. That is, as compared to existing frameworks that cannot provide this ability, the one or more embodiments described herein can provide a new result (e.g., the final set of pixel values 696) that was previously unavailable.

Another practical application can be mitigation of effect of broken pixel data. For example, an EH image after background subtraction (e.g., by the noise removing component 918) can be all 0 except for the hologram signal. A broken pixel can produce a strong phantom signal. The one or more methods described herein can generate resultant 0 values for the broken pixel regardless of the pixel value as long as the broken pixel always returns the same value. As noted, the broken pixel still can have a negative effect on the reconstructed image, but this effect can be reduced by orders of magnitude using the one or more embodiments described herein.

These are useful and practical applications of computers, thus providing enhanced (e.g., improved and/or optimized) material analysis and pixel value data output. Overall, such computerized tools can constitute a concrete and tangible technical improvement in the fields of material analysis, and more particularly in material analysis using electron hologram techniques.

Furthermore, one or more embodiments described herein can be employed in a real-world system based on the disclosed teachings. For example, as noted above, in cases emission interference, the one or more embodiments described herein can perform a successful pixel value preparation in advance of a reconstruction of a hologram, with the reconstruction resultingly having reduced artifacts and/or distortion as compared to existing techniques. The embodiments disclosed herein thus can provide improvements to scientific instrument technology (e.g., improvements in the computer technology supporting such scientific instruments, among other improvements).

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to material analysis using holograms, as compared to existing systems and/or techniques using holograms. Systems, computer-implemented methods and/or computer program products providing performance of these processes are of great utility in the fields of material analysis, such as comprising use of electron energy holograms and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively analyze an electron energy hologram and associated digital pixel data as the one or more embodiments described herein can provide this process. Moreover, neither can the human mind nor a human with pen and paper conduct one or more of these processes, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing one or more of the one or more operations described herein.

To provide additional summary, a listing of embodiments and features thereof is next provided.

A system, comprising: a memory that stores computer executable components; and a processor that executes the computer executable components stored in the memory, wherein the computer executable components comprise: a blurring component that executes a primary blurring action and a secondary blurring action on an original electron holography (EH) image characterized by a set of pixels having a set of original pixel values; and a generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

The system of the preceding paragraph, wherein the generating component further generates a set of final pixel values, for the set of pixels, based on a difference of the set of modified pixel values and a set of interim pixel values, of the set of pixels, resulting from execution of the secondary blurring action on the original EH image absent prior execution of the primary blurring action.

The system of any preceding paragraph, wherein the primary blurring action comprises a distortion of the original EH image that is caused by a physical vibration of an imaging device generating the original EH image.

The system of any preceding paragraph, wherein the second blurring action comprises use of Gaussian blurring.

The system of any preceding paragraph, wherein the computer executable components further comprise: a notifying component that generates a notification corresponding to a determination that an image based on the set of modified pixel values comprises a reduced level of contamination as compared to an original level of contamination of the original EH image.

The system of any preceding paragraph, wherein the computer executable components further comprise: an analyzing component that analyzes the original EH image and outputs the set original of pixel values, for the set of pixels, wherein the set of original pixel values is based on at least one of pixel color value or pixel luminosity value.

The system of any preceding paragraph, wherein the blurring component executes the secondary blurring action successively after completion of execution of the primary blurring action.

The system of any preceding paragraph, wherein the computer executable components further comprise: a noise removing component that generates a set of noise-reduced pixel values, for the set of pixels, based on a difference in a set of noisy pixel values, for the set of pixels, and a set of ambient pixel values, for the set of pixels, obtained from an image capture without generation of an electron beam.

A computer-implemented method, comprising: executing, by a system operatively coupled to a processor, a primary blurring action and a secondary blurring action on an original electron holography (EH) image characterized by a set of pixels having a set of original pixel values; and generating, by the system, a set of modified pixel values, for the set of pixels, based on a difference of a set of first pixel values, of the set of pixels, resulting from the primary blurring action and a set of second pixel values, of the set of pixels, resulting from the secondary blurring action.

The computer-implemented method of the preceding paragraph, further comprising: generating, by the system, a set of final pixel values, for the set of pixels, based on a difference of the set of modified pixel values and a set of interim pixel values, of the set of pixels, resulting from execution of the secondary blurring action on the original EH image absent prior execution of the primary blurring action.

The computer-implemented method of any preceding paragraph, further comprising: wherein the primary blurring action comprises a distortion of the original EH image that is caused by a physical vibration of an imaging device generating the original EH image, and wherein the second blurring action comprises use of Gaussian blur.

The computer-implemented method of any preceding paragraph, further comprising: generating, by the system, a notification corresponding to a determination that an image based on the set of modified pixel values comprises a reduced level of contamination as compared to an original level of contamination of the original EH image.

The computer-implemented method of any preceding paragraph, further comprising: analyzing, by the system, the original EH image; and outputting, by the system, the set original of pixel values, for the set of pixels, wherein the set of original pixel values is based on at least one of pixel color value or pixel luminosity value.

The computer-implemented method of any preceding paragraph, wherein the secondary blurring action is executed successively after completion of execution of the primary blurring action.

A computer program product facilitating a process for electron holography image background extraction, the computer program product comprising a computer readable storage medium having program instructions embodied therewith, and the program instructions executable by a processor to cause the processor to: execute, by the processor, a primary blurring action and a secondary blurring action on an original electron holography (EH) image characterized by a set of pixels having a set of original pixel values; and generate, by the processor, a set of modified pixel values, for the set of pixels, based on a difference of a set of first pixel values, of the set of pixels, resulting from the primary blurring action and a set of second pixel values, of the set of pixels, resulting from the secondary blurring action.

The computer program product of the preceding paragraph, wherein the program instructions are further executable by the processor to cause the processor to: generate, by the processor, a set of final pixel values, for the set of pixels, based on a difference of the set of modified pixel values and a set of interim pixel values, of the set of pixels, resulting from execution of the secondary blurring action on the original EH image absent prior execution of the primary blurring action.

The computer program product of any preceding paragraph, wherein the primary blurring action comprises a distortion of the original EH image that is caused by a physical vibration of an imaging device generating the original EH image, and wherein the second blurring action comprises use of Gaussian blur.

The computer program product of any preceding paragraph, wherein the program instructions are further executable by the processor to cause the processor to: generate, by the processor, a notification corresponding to a determination that an image based on the set of modified pixel values comprises a reduced level of contamination as compared to an original level of contamination of the original EH image.

The computer program product of any preceding paragraph, wherein the program instructions are further executable by the processor to cause the processor to: analyze, by the processor, the original EH image; and output, by the processor, the set original of pixel values, for the set of pixels, wherein the set of original pixel values is based on at least one of pixel color value or pixel luminosity value.

The computer program product of any preceding paragraph, wherein the secondary blurring action is executed successively after completion of execution of the primary blurring action.

A computer-implemented method, comprising: executing, by a system operatively coupled to a processor, a modification of a set of original pixel values of a set of pixels characterizing an original electron holography (EH) image, wherein the executing comprises employing a distortion technique at an imaging device capturing the EH image and subsequently applying a digital blurring to the set of original pixel values; and generating, by the system, a set of modified pixel values, for the set of pixels, based on a difference of a set of first pixel values, of the set of pixels, resulting from the employing of the distortion technique and a set of second pixel values, of the set of pixels, resulting from the applying of the digital blurring.

The computer-implemented method of the preceding paragraph, further comprising: generating, by the system, a set of final pixel values, for the set of pixels, based on a difference of the set of modified pixel values and a set of interim pixel values, of the set of pixels, resulting from execution of an application of the digital blurring or another digital blurring on the original EH image absent prior execution of the employing of the distortion technique.

The computer-implemented method of any preceding paragraph, further comprising: wherein the employing of the distortion technique comprises causing a physical vibration of a detector of the imaging device or applying an alternating electromagnetic field upstream of the detector.

The computer-implemented method of any preceding paragraph, further comprising: generating, by the system, a notification corresponding to a determination that an image based on the set of modified pixel values comprises a reduced level of contamination as compared to an original level of contamination of the original EH image.

The computer-implemented method of any preceding paragraph, further comprising: analyzing, by the system, the original EH image; and outputting, by the system, the set original of pixel values, for the set of pixels, wherein the set of original pixel values is based on at least one of pixel color value or pixel luminosity value.

The computer-implemented method of any preceding paragraph, wherein the applying the digital blurring is executed successively after the employing of the distortion technique.

Scientific Instrument System Description

Turning next to FIG. 21, a detailed description is provided of additional context for the one or more embodiments described herein at FIGS. 1-20. One or more computing devices implementing any of the scientific instrument modules or methods disclosed herein can be part of a scientific instrument system. FIG. 21 illustrates a block diagram of an example scientific instrument system 2100 in which one or more of the scientific instrument methods or other methods disclosed herein can be performed, in accordance with various embodiments described herein. The scientific instrument modules and methods disclosed herein (e.g., the scientific instrument module 100 of FIG. 1 and the method 200 of FIG. 2) can be implemented by one or more of the scientific instrument 2110, the user local computing device 2120, the service local computing device 2130, and/or the remote computing device 2140 of the scientific instrument system 2100.

Any of the scientific instrument 2110, the user local computing device 2120, the service local computing device 2130, and/or the remote computing device 2140 can include any of the embodiments of the computing device 400 discussed herein with reference to FIG. 4, and any of the scientific instrument 2110, the user local computing device 2120, the service local computing device 2130, and/or the remote computing device 2140 can take the form of any appropriate one or more of the embodiments of the computing device 400 discussed herein with reference to FIG. 4.

One or more of the scientific instrument 2110, the user local computing device 2120, the service local computing device 2130, and/or the remote computing device 2140 can include a processing device 2102, a storage device 2104, and/or an interface device 2106. The processing device 2102 can take any suitable form, including the form of any of the processors 402 discussed herein with reference to FIG. 4. The processing devices 2102 included in different ones of the scientific instrument 2110, the user local computing device 2120, the service local computing device 2130, and/or the remote computing device 2140 can take the same form or different forms. The storage device 2104 can take any suitable form, including the form of any of the storage devices 404 discussed herein with reference to FIG. 4. The storage devices 2104 included in different ones of the scientific instrument 2110, the user local computing device 2120, the service local computing device 2130, and/or the remote computing device 2140 can take the same form or different forms. The interface device 2106 can take any suitable form, including the form of any of the interface devices 406 discussed herein with reference to FIG. 4. The interface devices 2106 included in different ones of the scientific instrument 2110, the user local computing device 2120, the service local computing device 2130, and/or the remote computing device 2140 can take the same form or different forms.

The scientific instrument 2110, the user local computing device 2120, the service local computing device 2130, and/or the remote computing device 2140 can be in communication with other elements of the scientific instrument system 2100 via communication pathways 2108. The communication pathways 2108 can communicatively couple the interface devices 2106 of different ones of the elements of the scientific instrument system 2100, as shown, and can be wired or wireless communication pathways (e.g., in accordance with any of the communication techniques discussed herein with reference to the interface devices 406 of the computing device 400 of FIG. 4). The particular scientific instrument system 2100 depicted in FIG. 21 includes communication pathways between each pair of the scientific instrument 2110, the user local computing device 2120, the service local computing device 2130, and the remote computing device 2140, but this "fully connected" implementation is simply illustrative, and in various embodiments, various ones of the communication pathways 2108 can be omitted. For example, in one or more embodiments, a service local computing device 2130 can omit a direct communication pathway 2108 between its interface device 2106 and the interface device 2106 of the scientific instrument 2110, but can instead communicate with the scientific instrument 2110 via the communication pathway 2108 between the service local computing device 2130 and the user local computing device 2120 and/or the communication pathway 2108 between the user local computing device 2120 and the scientific instrument 2110.

The scientific instrument 2110 can include any appropriate scientific instrument, such as a separation or MS instrument, or other instrument facilitating material analysis.

The user local computing device 2120 can be a computing device (e.g., in accordance with any of the embodiments of the computing device 400 discussed herein) that is local to a user of the scientific instrument 2110. In one or more embodiments, the user local computing device 2120 can also be local to the scientific instrument 2110, but this need not be the case; for example, a user local computing device 2120 that is associated with a home, office or other building associated with a user entity can be remote from, but in communication with, the scientific instrument 2110 so that the user entity can use the user local computing device 2120 to control and/or access data from the scientific instrument 2110. In one or more embodiments, the user local computing device 2120 can be a laptop, smartphone, or tablet device. In one or more embodiments the user local computing device 2120 can be a portable computing device. In one or more embodiments, the user local computing device 2120 can deployed in the field.

The service local computing device 2130 can be a computing device (e.g., in accordance with any of the embodiments of the computing device 400 discussed herein) that is local to an entity that services the scientific instrument 2110. For example, the service local computing device 2130 can be local to a manufacturer of the scientific instrument 2110 or to a third-party service company. In one or more embodiments, the service local computing device 2130 can communicate with the scientific instrument 2110, the user local computing device 2120, and/or the remote computing device 2140 (e.g., via a direct communication pathway 2108 or via multiple "indirect" communication pathways 2108, as discussed above) to receive data regarding the operation of the scientific instrument 2110, the user local computing device 2120, and/or the remote computing device 2140 (e.g., the results of self-tests of the scientific instrument 2110, calibration coefficients used by the scientific instrument 2110, the measurements of sensors associated with the scientific instrument 2110, etc.). In one or more embodiments, the service local computing device 2130 can communicate with the scientific instrument 2110, the user local computing device 2120, and/or the remote computing device 2140 (e.g., via a direct communication pathway 2108 or via multiple "indirect" communication pathways 2108, as discussed above) to transmit data to the scientific instrument 2110, the user local computing device 2120, and/or the remote computing device 2140 (e.g., to update programmed instructions, such as firmware, in the scientific instrument 2110, to initiate the performance of test or calibration sequences in the scientific instrument 2110, to update programmed instructions, such as software, in the user local computing device 2120 or the remote computing device 2140, etc.). A user entity of the scientific instrument 2110 can utilize the scientific instrument 2110 or the user local computing device 2120 to communicate with the service local computing device 2130 to report a problem with the scientific instrument 2110 or the user local computing device 2120, to request a visit from a technician to improve the operation of the scientific instrument 2110, to order consumables or replacement parts associated with the scientific instrument 2110, or for other purposes.

The remote computing device 2140 can be a computing device (e.g., in accordance with any of the embodiments of the computing device 400 discussed herein) that is remote from the scientific instrument 2110 and/or from the user local computing device 2120. In one or more embodiments, the remote computing device 2140 can be included in a datacenter or other large-scale server environment. In one or more embodiments, the remote computing device 2140 can include network-attached storage (e.g., as part of the storage device 2104). The remote computing device 2140 can store data generated by the scientific instrument 2110, perform analyses of the data generated by the scientific instrument 2110 (e.g., in accordance with programmed instructions), facilitate communication between the user local computing device 2120 and the scientific instrument 2110, and/or facilitate communication between the service local computing device 2130 and the scientific instrument 2110.

In one or more embodiments, one or more of the elements of the scientific instrument system 2100 illustrated in FIG. 21 can be omitted. Further, in one or more embodiments, multiple ones of various ones of the elements of the scientific instrument system 2100 of FIG. 21 can be present. For example, a scientific instrument system 2100 can include multiple user local computing devices 2120 (e.g., different user local computing devices 2120 associated with different user entities or in different locations). In another example, a scientific instrument system 2100 can include multiple scientific instruments 2110, all in communication with service local computing device 2130 and/or a remote computing device 2140; in such an embodiment, the service local computing device 2130 can monitor these multiple scientific instruments 2110, and the service local computing device 2130 can cause updates or other information can be "broadcast" to multiple scientific instruments 2110 at the same time. Different ones of the scientific instruments 2110 in a scientific instrument system 2100 can be located close to one another (e.g., in the same room) or farther from one another (e.g., on different floors of a building, in different buildings, in different cities, etc.). In one or more embodiments, a scientific instrument 2110 can be connected to an Internet-of-Things (IoT) stack that allows for command and control of the scientific instrument 2110 through a web-based application, a virtual or augmented reality application, a mobile application, and/or a desktop application. Any of these applications can be accessed by a user entity operating the user local computing device 2120 in communication with the scientific instrument 2110 by the intervening remote computing device 2140. In one or more embodiments, a scientific instrument 2110 can be sold by the manufacturer along with one or more associated user local computing devices 2120 as part of a local scientific instrument computing unit 2112.

In one or more embodiments, different ones of the scientific instruments 2110 included in a scientific instrument system 2100 can be different types of scientific instruments 2110; for example, one scientific instrument 2110 can be an EDS device, while another scientific instrument 2110 can be an analysis device that analyzes results of an EDS device. In some such embodiments, the remote computing device 2140 and/or the user local computing device 2120 can combine data from different types of scientific instruments 2110 included in a scientific instrument system 2100.

Example Operating Environment

FIG. 22 is a schematic block diagram of an operating environment 2200 with which the described subject matter can interact. The operating environment 2200 comprises one or more remote component(s) 2210. The remote component(s) 2210 can be hardware and/or software (e.g., threads, processes, computing devices). In one or more embodiments, remote component(s) 2210 can be a distributed computer system, connected to a local automatic scaling component and/or programs that use the resources of a distributed computer system, via communication framework 2240. Communication framework 2240 can comprise wired network devices, wireless network devices, mobile devices, wearable devices, radio access network devices, gateway devices, femtocell devices, servers, etc.

The operating environment 2200 also comprises one or more local component(s) 2220. The local component(s) 2220 can be hardware and/or software (e.g., threads, processes, computing devices). In one or more embodiments, local component(s) 2220 can comprise an automatic scaling component and/or programs that communicate/use the remote resources 2210 and 2220, etc., connected to a remotely located distributed computing system via communication framework 2240.

One possible communication between a remote component(s) 2210 and a local component(s) 2220 can be in the form of a data packet adapted to be transmitted between two or more computer processes. Another possible communication between a remote component(s) 2210 and a local component(s) 2220 can be in the form of circuit-switched data adapted to be transmitted between two or more computer processes in radio time slots. The operating environment 2200 comprises a communication framework 2240 that can be employed to facilitate communications between the remote component(s) 2210 and the local component(s) 2220, and can comprise an air interface, e.g., interface of a UMTS network, via an LTE network, etc. Remote component(s) 2210 can be operably connected to one or more remote data store(s) 2250, such as a hard drive, solid state drive, subscriber identity module (SIM) card, electronic SIM (eSIM), device memory, etc., that can be employed to store information on the remote component(s) 2210 side of communication framework 2240. Similarly, local component(s) 2220 can be operably connected to one or more local data store(s) 2230, that can be employed to store information on the local component(s) 2220 side of communication framework 2240.

Example Computing Environment

In order to provide additional context for various embodiments described herein, FIG. 15 and the following discussion are intended to provide a brief, general description of a suitable computing environment 1500 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform tasks or implement abstract data types. Moreover, the methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data, or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory, or computer-readable media, exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries, or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Referring still to FIG. 23, the example computing environment 2300 which can implement one or more embodiments described herein includes a computer 2302, the computer 2302 including a processing unit 2304, a system memory 2306 and a system bus 2308. The system bus 2308 couples system components including, but not limited to, the system memory 2306 to the processing unit 2304. The processing unit 2304 can be any of various commercially available processors. Dual microprocessors and other multi processor architectures can also be employed as the processing unit 2304.

The system bus 2308 can be any of several types of bus structure that can further interconnect to a memory bus (with or without a memory controller), a peripheral bus, and a local bus using any of a variety of commercially available bus architectures. The system memory 2306 includes ROM 2310 and RAM 2312. A basic input/output system (BIOS) can be stored in a non-volatile memory such as ROM, erasable programmable read only memory (EPROM), EEPROM, which BIOS contains the basic routines that help to transfer information between elements within the computer 2302, such as during startup. The RAM 2312 can also include a high-speed RAM such as static RAM for caching data.

The computer 2302 further includes an internal hard disk drive (HDD) 2314 (e.g., EIDE, SATA), and can include one or more external storage devices 2316 (e.g., a magnetic floppy disk drive (FDD) 2316, a memory stick or flash drive reader, a memory card reader, etc.). While the internal HDD 2314 is illustrated as located within the computer 2302, the internal HDD 2314 can also be configured for external use in a suitable chassis (not shown). Additionally, while not shown in computing environment 2300, a solid-state drive (SSD) could be used in addition to, or in place of, an HDD 2314.

Other internal or external storage can include at least one other storage device 2320 with storage media 2322 (e.g., a solid-state storage device, a nonvolatile memory device, and/or an optical disk drive that can read or write from removable media such as a CD-ROM disc, a DVD, a BD, etc.). The external storage 2316 can be facilitated by a network virtual machine. The HDD 2314, external storage device 2316 and storage device (e.g., drive) 2320 can be connected to the system bus 2308 by an HDD interface 2324, an external storage interface 2326 and a drive interface 2328, respectively.

The drives and their associated computer-readable storage media provide nonvolatile storage of data, data structures, computer-executable instructions, and so forth. For the computer 2302, the drives and storage media accommodate the storage of any data in a suitable digital format. Although the description of computer-readable storage media above refers to respective types of storage devices, other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2312, including an operating system 2330, one or more application programs 2332, other program modules 2334 and program data 2336. All or portions of the operating system, applications, modules, and/or data can also be cached in the RAM 2312. The systems and methods described herein can be implemented utilizing various commercially available operating systems or combinations of operating systems.

Computer 2302 can optionally comprise emulation technologies. For example, a hypervisor (not shown) or other intermediary can emulate a hardware environment for operating system 2330, and the emulated hardware can optionally be different from the hardware illustrated in FIG. 23. In such an embodiment, operating system 2330 can comprise one virtual machine (VM) of multiple VMs hosted at computer 2302. Furthermore, operating system 2330 can provide runtime environments, such as the Java runtime environment or the .NET framework, for applications 2332. Runtime environments are consistent execution environments that allow applications 2332 to run on any operating system that includes the runtime environment. Similarly, operating system 2330 can support containers, and applications 2332 can be in the form of containers, which are lightweight, standalone, executable packages of software that include, e.g., code, runtime, system tools, system libraries and settings for an application.

Further, computer 2302 can be enabled with a security module, such as a trusted processing module (TPM). For instance, with a TPM, boot components hash next in time boot components, and wait for a match of results to secured values, before loading a next boot component. This process can take place at any layer in the code execution stack of computer 2302, e.g., applied at the application execution level or at the operating system (OS) kernel level, thereby enabling security at any level of code execution.

A user entity can enter commands and information into the computer 2302 through one or more wired/wireless input devices, e.g., a keyboard 2338, a touch screen 2340, and a pointing device, such as a mouse 2342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera, a gesture sensor input device, a vision movement sensor input device, an emotion or facial detection device, a biometric input device, e.g., fingerprint or iris scanner, or the like. These and other input devices are often connected to the processing unit 2304 through an input device interface 2344 that can be coupled to the system bus 2308, but can be connected by other interfaces, such as a parallel port, an IEEE 1394 serial port, a game port, a USB port, an IR interface, a BLUETOOTH® interface, etc.

A monitor 2346 or other type of display device can also be connected to the system bus 2308 via an interface, such as a video adapter 2348. In addition to the monitor 2346, a computer typically includes other peripheral output devices (not shown), such as speakers, printers, etc.

The computer 2302 can operate in a networked environment using logical connections via wired and/or wireless communications to one or more remote computers, such as a remote computer 2350. The remote computer 2350 can be a workstation, a server computer, a router, a personal computer, portable computer, microprocessor-based entertainment appliance, a peer device or other common network node, and typically includes many or all of the elements described relative to the computer 2302, although, for purposes of brevity, only a memory/storage device 2352 is illustrated. The logical connections depicted include wired/wireless connectivity to a local area network (LAN) 2354 and/or larger networks, e.g., a wide area network (WAN) 2356. Such LAN and WAN networking environments are commonplace in offices and companies, and facilitate enterprise-wide computer networks, such as intranets, all of which can connect to a global communications network, e.g., the Internet.

When used in a LAN networking environment, the computer 2302 can be connected to the local network 2354 through a wired and/or wireless communication network interface or adapter 2358. The adapter 2358 can facilitate wired or wireless communication to the LAN 2354, which can also include a wireless access point (AP) disposed thereon for communicating with the adapter 2358 in a wireless mode.

When used in a WAN networking environment, the computer 2302 can include a modem 2360 or can be connected to a communications server on the WAN 2356 via other means for establishing communications over the WAN 2356, such as by way of the Internet. The modem 2360, which can be internal or external and a wired or wireless device, can be connected to the system bus 2308 via the input device interface 2344. In a networked environment, program modules depicted relative to the computer 2302 or portions thereof, can be stored in the remote memory/storage device 2352. The network connections shown are example and other means of establishing a communications link between the computers can be used.

When used in either a LAN or WAN networking environment, the computer 2302 can access cloud storage systems or other network-based storage systems in addition to, or in place of, external storage devices 2316 as described above. Generally, a connection between the computer 2302 and a cloud storage system can be established over a LAN 2354 or WAN 2356 e.g., by the adapter 2358 or modem 2360, respectively. Upon connecting the computer 2302 to an associated cloud storage system, the external storage interface 2326 can, with the aid of the adapter 2358 and/or modem 2360, manage storage provided by the cloud storage system as it would other types of external storage. For instance, the external storage interface 2326 can be configured to provide access to cloud storage sources as if those sources were physically connected to the computer 2302.

The computer 2302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a defined structure as with an existing network or simply an ad hoc communication between at least two devices.

Additional Information

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments can use the phrases "an embodiment," "various embodiments," "one or more embodiments" and/or "some embodiments," each of which can refer to one or more of the same or different embodiments.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A system, comprising:

a memory that stores computer executable components; and a processor that executes the computer executable components stored in the memory, wherein the computer executable components comprise:

a blurring component that executes a primary blurring action and a secondary blurring action on an original electron holography (EH) image characterized by a set of pixels having a set of original pixel values; and a generating component that generates a set of modified pixel values, for the set of pixels, based on a difference of a set of first pixel values, of the set of pixels, resulting from the primary blurring action and a set of second pixel values, of the set of pixels, resulting from the secondary blurring action.

2. The system of claim 1, wherein the generating component further generates a set of final pixel values, for the set of pixels, based on a difference of the set of modified pixel values and a set of interim pixel values, of the set of pixels, resulting from execution of the secondary blurring action on the original EH image absent prior execution of the primary blurring action.

3. The system of claim 1, wherein the primary blurring action comprises a distortion of the original EH image that is caused by a physical vibration of an imaging device generating the original EH image.

4. The system of claim 1, wherein the secondary blurring action comprises use of Gaussian blurring.

5. The system of claim 1, wherein the computer executable components further comprise:

a notifying component that generates a notification corresponding to a determination that an image based on the set of modified pixel values comprises a reduced level of contamination as compared to an original level of contamination of the original EH image.

6. The system of claim 1, wherein the computer executable components further comprise:

an analyzing component that analyzes the original EH image and outputs the set of original of pixel values, for the set of pixels, wherein the set of original pixel values is based on at least one of pixel color value or pixel luminosity value.

7. The system of claim 1, wherein the blurring component executes the secondary blurring action successively after completion of execution of the primary blurring action.

8. The system of claim 1, wherein the computer executable components further comprise:

a noise removing component that generates a set of noise-reduced pixel values, for the set of pixels, based on a difference in a set of noisy pixel values, for the set of pixels, and a set of ambient pixel values, for the set of pixels, obtained from an image capture without generation of an electron beam.

9. A computer-implemented method, comprising:

executing, by a system operatively coupled to a processor, a modification of a set of original pixel values of a set of pixels characterizing an original electron holography (EH) image, wherein the executing comprises employing a distortion technique at an imaging device capturing the EH image and subsequently applying a digital blurring to the set of original pixel values; and generating, by the system, a set of modified pixel values, for the set of pixels, based on a difference of a set of first pixel values, of the set of pixels, resulting from the employing of the distortion technique and a set of second pixel values, of the set of pixels, resulting from the applying of the digital blurring.

10. The computer-implemented method of claim 9, further comprising:

generating, by the system, a set of final pixel values, for the set of pixels, based on a difference of the set of modified pixel values and a set of interim pixel values, of the set of pixels, resulting from execution of an application of the digital blurring or another digital blurring on the original EH image absent prior execution of the employing of the distortion technique.

11. The computer-implemented method of claim 9, wherein the employing of the distortion technique comprises causing a physical vibration of a detector of the imaging device or applying an alternating electromagnetic field upstream of the detector.

12. The computer-implemented method of claim 9, further comprising:

generating, by the system, a notification corresponding to a determination that an image based on the set of modified pixel values comprises a reduced level of contamination as compared to an original level of contamination of the original EH image.

13. The computer-implemented method of claim 9, further comprising:

analyzing, by the system, the original EH image; and outputting, by the system, the set of original of pixel values, for the set of pixels, wherein the set of original pixel values is based on at least one of pixel color value or pixel luminosity value.

14. The computer-implemented method of claim 9, wherein the applying the digital blurring is executed successively after the employing of the distortion technique.

15. A computer program product facilitating a process for electron holography image background extraction, the computer program product comprising a non-transitory computer readable storage medium having program instructions embodied therewith, and the program instructions executable by a processor to cause the processor to:

execute, by the processor, a primary blurring action and a secondary blurring action on an original electron holography (EH) image characterized by a set of pixels having a set of original pixel values; and generate, by the processor, a set of modified pixel values, for the set of pixels, based on a difference of a set of first pixel values, of the set of pixels, resulting from the primary blurring action and a set of second pixel values, of the set of pixels, resulting from the secondary blurring action.

16. The computer program product of claim 15, wherein the program instructions are further executable by the processor to cause the processor to:

generate, by the processor, a set of final pixel values, for the set of pixels, based on a difference of the set of modified pixel values and a set of interim pixel values, of the set of pixels, resulting from execution of the secondary blurring action on the original EH image absent prior execution of the primary blurring action.

17. The computer program product of claim 15, wherein the primary blurring action comprises a distortion of the original EH image that is caused by a physical vibration of an imaging device generating the original EH image, and wherein the secondary blurring action comprises use of Gaussian blur.

18. The computer program product of claim 15, wherein the program instructions are further executable by the processor to cause the processor to:

generate, by the processor, a notification corresponding to a determination that an image based on the set of modified pixel values comprises a reduced level of contamination as compared to an original level of contamination of the original EH image.

19. The computer program product of claim 15, wherein the program instructions are further executable by the processor to cause the processor to:

analyze, by the processor, the original EH image; and output, by the processor, the set of original of pixel values, for the set of pixels, wherein the set of original pixel values is based on at least one of pixel color value or pixel luminosity value.

20. The computer program product of claim 15, wherein the secondary blurring action is executed successively after completion of execution of the primary blurring action.

* * * * *